United States Patent
Kawasaki

(10) Patent No.: US 9,231,523 B2
(45) Date of Patent: Jan. 5, 2016

(54) MODULATING DEVICE AND MODULATION METHOD

(71) Applicant: FUJITSU LIMITED, Kawasaki-shi, Kanagawa (JP)

(72) Inventor: Toshio Kawasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/220,776

(22) Filed: Mar. 20, 2014

(65) Prior Publication Data

US 2014/0285276 A1    Sep. 25, 2014

(30) Foreign Application Priority Data

Mar. 22, 2013    (JP) .................................. 2013-060479

(51) Int. Cl.

| | | |
|---|---|---|
| H03C 3/00 | (2006.01) | |
| H04L 27/20 | (2006.01) | |
| H04L 25/06 | (2006.01) | |
| H03C 5/00 | (2006.01) | |
| H03C 3/02 | (2006.01) | |

(52) U.S. Cl.
CPC .. *H03C 5/00* (2013.01); *H03C 3/00* (2013.01); *H03C 3/02* (2013.01); *H04L 25/067* (2013.01); *H04L 27/20* (2013.01); *H04L 27/206* (2013.01); *H03C 2200/0041* (2013.01); *H03C 2200/0058* (2013.01)

(58) Field of Classification Search
CPC .............. H03C 3/40; H03C 3/00; H03C 3/02; H03C 3/08; H03C 5/00; H03C 2200/0058; H03C 2200/0041; H04L 27/12; H04L 27/20; H04L 27/206; H04L 25/061; H04L 25/063; H04L 25/064; H03F 1/3294

USPC ........................... 332/103; 375/296, 297, 298
See application file for complete search history.

(56) References Cited

U.S. PATENT DOCUMENTS

| | | | | |
|---|---|---|---|---|
| 6,940,916 | B1 * | 9/2005 | Warner et al. ................. | 375/261 |
| 7,688,914 | B2 * | 3/2010 | Ohba et al. ..................... | 375/296 |
| 2001/0010713 | A1 * | 8/2001 | Yamamoto .................... | 375/297 |
| 2002/0097811 | A1 * | 7/2002 | Kubo et al. .................... | 375/296 |
| 2007/0241816 | A1 * | 10/2007 | Okazaki et al. ............... | 330/149 |
| 2010/0297966 | A1 * | 11/2010 | Row et al. .................. | 455/114.3 |

FOREIGN PATENT DOCUMENTS

| | | | |
|---|---|---|---|
| JP | 10-079693 | A | 3/1998 |
| JP | 2000-349844 | A | 12/2000 |
| JP | 2001-007882 | A | 1/2001 |
| JP | 2001-333124 | A | 11/2001 |
| JP | 2002-077285 | A | 3/2002 |
| JP | 2004-363757 | A | 12/2004 |

* cited by examiner

*Primary Examiner* — Ryan Johnson
(74) *Attorney, Agent, or Firm* — Arent Fox LLP

(57) ABSTRACT

A modulating device including: a first convertor configured to generate a converted analog signal by analog conversion on a input digital signal, a modulator configured to generate a modulated signal by quadrature modulation, a phase shifter configured to generate a phase shift signal by phase rotation, a demodulator configured to generate a demodulated signal by quadrature demodulation, a second convertor to generate a converted digital signal by digital conversion, a calculating circuit configured to estimate a first direct current offset based on the input digital signal and the converted digital signal, the first direct current offset being a noise of digital current component generated between the input digital signal inputted to the first convertor and the output signal inputted to the demodulator, and a correcting circuit configured to correct at least one among from the input digital signal to the output signal based on the first direct current offset.

13 Claims, 14 Drawing Sheets

MODULATING DEVICE AND MODULATION METHOD

CROSS-REFERENCE TO RELATED APPLICATION

This application is based upon and claims the benefit of priority from the prior Japanese Patent Application No. 2013-060479 filed on Mar. 22, 2013, the entire contents of which are incorporated herein by reference.

FIELD

The embodiments discussed herein are related to a modulating device and a modulation method.

BACKGROUND

Upon receiving signals to be transmitted, conventional wireless communication devices that conduct communication with wireless signals convert, to modulation signals, signals to be transmitted received as local signals and then transmit the converted signals by using a quadrature modulation circuit to perform quadrature modulation on the local signals that become carrier waves. Modulation systems for performing quadrature modulation use quadrature phase shift keying (QPSK) or quadrature amplitude modulation (QAM) and the like. However, a DC offset is produced as noise due to imperfections of the elements in the abovementioned quadrature modulation circuit and the DC offset is added to the modulation signals.

Accordingly, Japanese Laid-open Patent Publication No. 10-079693 describes a technique for calculating a DC offset of a quadrature modulation circuit, for example, by providing a feedback circuit that provides feedback by using a quadrature demodulation circuit to perform quadrature demodulation on modulation signals, and by switching inputs and non-inputs of the modulation signals to the feedback circuit. Moreover, Japanese Laid-open Patent Publication No. 2002-077285 describes a technique for calculating a DC offset of a quadrature modulation circuit by using, for example, a frequency converting circuit to convert modulation signals to IF signals and then by using an ADC to perform digital conversion to provide feedback.

SUMMARY

According to an aspect of the invention, a modulating device includes a first convertor configured to generate a converted analog signal by analog conversion on a input digital signal that is inputted to the first converter, a modulator configured to generate a modulated signal by quadrature modulation on the converted analog signal, a first phase shifter configured to generate a first phase shift signal by first phase rotation on a local signal by a phase shift quantity that changes with a period, a demodulator configured to generate a demodulated signal by quadrature demodulation on an output signal using the first phase shift signal, the output signal deriving from the modulated signal and being outputted from the modulating device, the quadrature demodulation corresponding to the quadrature modulation, a second convertor to generate a converted digital signal by digital conversion on the demodulated signal, a calculating circuit configured to estimate the first direct current offset based on the input digital signal and the converted digital signal, the first direct current offset being a noise of digital current component generated between the input digital signal inputted to the first convertor and the output signal inputted to the demodulator, and a correcting circuit configured to correct at least one among from the input digital signal to the output signal based on the first direct current offset.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

However, in the abovementioned conventional techniques, the DC offset produced by the quadrature modulation circuit may not be detected accurately and the DC offset of the modulation signals may not be accurately compensated.

An object in one aspect of the embodiments discussed herein is to accurately compensate the DC offset of the modulation signals.

Detailed explanations of embodiments of the modulating unit and the modulation method described hereinbelow will be provided with reference to the accompanying drawings.

(Baseband Model for Modulating Device 100 According to an Embodiment)

Figure 1:
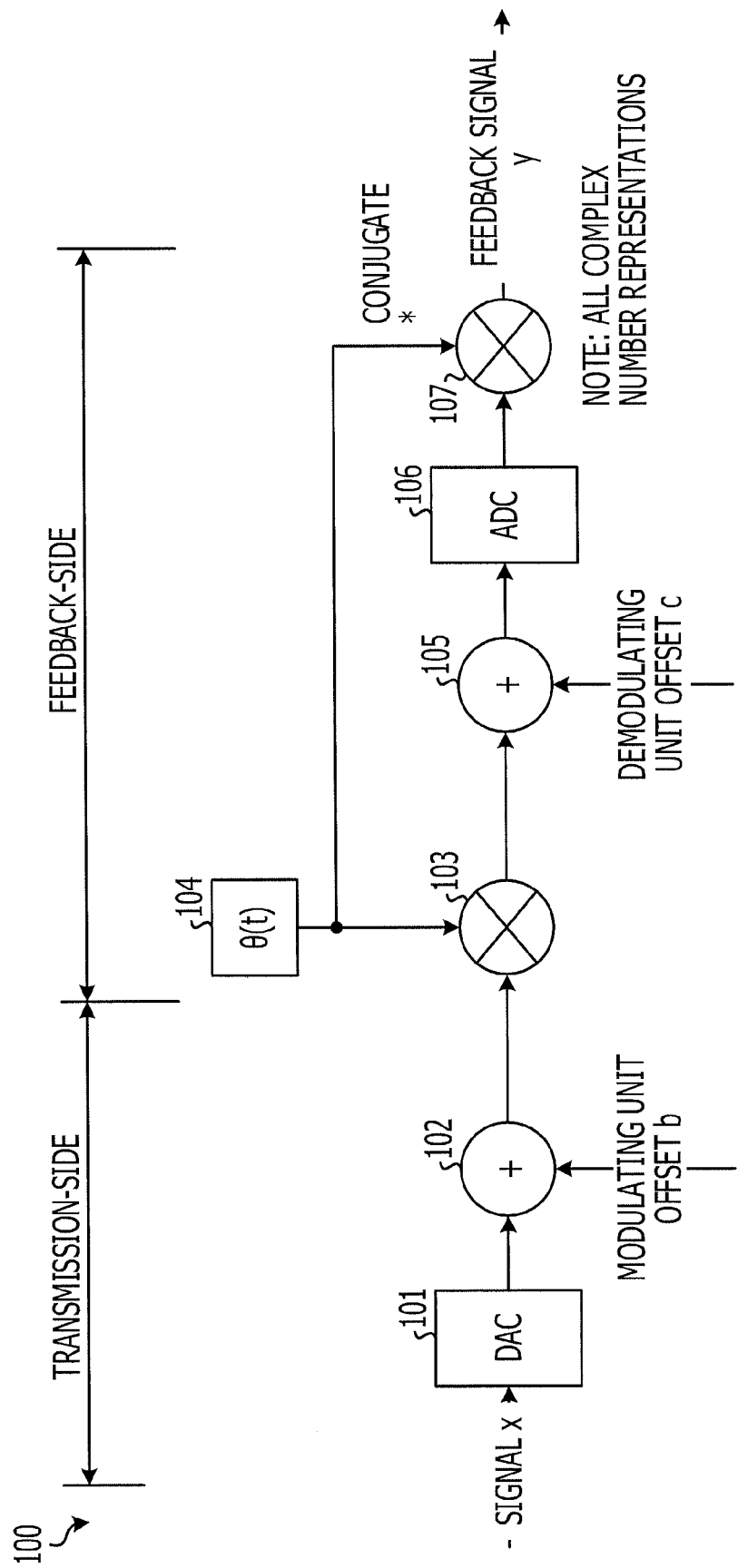
FIG. 1 illustrates a baseband model for a modulating device according to an embodiment.

FIG. 1 illustrates a baseband model for a modulating device 100 according to an embodiment. The modulating device 100 is a device for performing analog conversion and quadrature modulation of input digital signals and then transmitting the signals. In the example in FIG. 1, a digital signal is, for example, a signal represented by a complex number having a real number part and an imaginary number part. The modulating device 100 performs quadrature demodulation and digital conversion of the signals to be transmitted to provide feedback.

In FIG. 1, the modulating device 100 has, for example, a DAC and a QMOD as transmission-side circuits. The modulating device 100 has, for example, a first complex multiplier, an ADC, a QDEM, and a second complex multiplier as feedback-side circuits.

The digital to analog converter (DAC) is a circuit for performing analog conversion on signals. The quadrature modulating unit (QMOD) is a circuit for performing quadrature modulation on signals.

The first complex multiplier is a circuit for performing phase rotation of signals in phase shift quantities that change periodically. The analog to digital converter (ADC) is a circuit for performing digital conversion on signals. The quadrature demodulating unit (QDEM) is a circuit for performing quadrature demodulation on signals. The second complex multiplier is a circuit for performing phase rotation on signals in the direction opposite that of the first complex multiplier and in the same phase shift quantity as the first complex multiplier.

In FIG. 1, a digital signal x that is to be transmitted is input into the DAC and converted to analog by the DAC in the transmission-side circuits. Next, the signal x analog-converted by the DAC is input into the QMOD and quadrature modulation is performed by the QMOD. When processed by the DAC and the QMOD, a DC offset b produced in the DAC and the QMOD is added to the signal x.

The DC offset is, for example, direct current component noise which is noise that is produced when actual circuit characteristics deviate from the ideal characteristics due to aging and production variances of circuit elements included in circuits such as the DAC, the QMOD, the QDEM, and the ADC and the like. In the following explanation, the DC offset may be referred to as a "modulating unit offset b" along with the DC offset produced by the DAC and the QDEM.

In other words, in the transmission-side circuits, the digital signal x is analog-converted as indicated by reference numeral 101, and the modulating unit offset b is added as indicated by reference numeral 102 so that the signal x becomes modulation signal x+b, which is then transmitted and input into the feedback-side circuits.

In FIG. 1, the modulation signal x+b in the feedback-side circuits is input into the first complex multiplier and phase-rotated by $\theta(t)$ by the first complex multiplier. In this case, $\theta(t)$ is represented, for example, by multiplying an angular speed w by a time t to produce wt. Next, the signal $(x+b) \times \exp(j\theta(t))$ phase-converted by the first complex multiplier is in input into the QDEM and quadrature demodulation is performed by the QDEM. The signal $(x+b) \times \exp(j\theta(t))$ quadrature-demodulated by the QDEM is input into the ADC and digitally-converted by the ADC.

When processed by the QDEM and the ADC, a DC offset c produced by the QDEM and the ADC is added to the signal $(x+b) \times \exp(j\theta(t))$. In the following explanation, the DC offset may be referred to as a "demodulating unit offset c" along with the DC offset produced by the QMOD and the ADC. Next, the signal $(x+b) \times \exp(j\theta(t))+c$ to which was added the demodulating unit offset c, is input into the second complex multiplier and phase-rotated only $\theta(t)^*$ by the second complex multiplier. Here, the * symbol indicates a conjugate.

In other words, in the feedback-side circuits, the modulation signal x+b is phase-rotated by using a signal to be phase-rotated by the $\theta(t)$ of the reference numeral 104 as indicated by reference numeral 103. Further, the demodulating unit offset c as indicated by the reference numeral 105 is added to the modulation signal x+b and digitally-converted as indicated by the reference numeral 106. The modulation signal x+b is phase-rotated in the opposite direction from the reference numeral 103 by using a signal to be phase-rotated by the $\theta(t)$ of the reference numeral 104 as indicated by reference numeral 107. Consequently, the modulation signal x+b becomes the feedback signal $y=\{(x+b) \times \exp(j\theta(t))+c\} \times \exp(j\theta(t))^* = x+b+c \times \exp(j\theta(t))^*$ and is fed back.

In this way, before and after the transmitted signal x+b is quadrature-demodulated, a feedback signal $y=x+b+c \times \exp(j\theta(t))^*$ is obtained by providing feedback while performing phase rotation in the feedback-side circuits. The modulating unit offset b produced by the transmission-side circuits and the demodulating unit offset c produced by the feedback-side circuits in the feedback signal y are each elements with different frequencies.

As a result, the modulating device 100 separates the modulating unit offset b produced by the transmission-side circuits and the demodulating unit offset c produced by the feedback-side circuits on the basis of the elements with the different frequencies and is able to specify the modulating unit offset b. The modulating device 100 then sets the specified modulating unit offset b as a compensation value b' of the modulating unit offset b and inputs the compensation value b' into the transmission-side circuits in order to subtract the compensation value b' from the modulation signal x+b to remove the modulating unit offset b in the transmission-side circuits. As a result, the modulating device 100 is able to erase the modulating unit offset and transmit a more accurate modulation signal.

(Example of Functional Configuration of Modulating Device 100)

Figure 2:
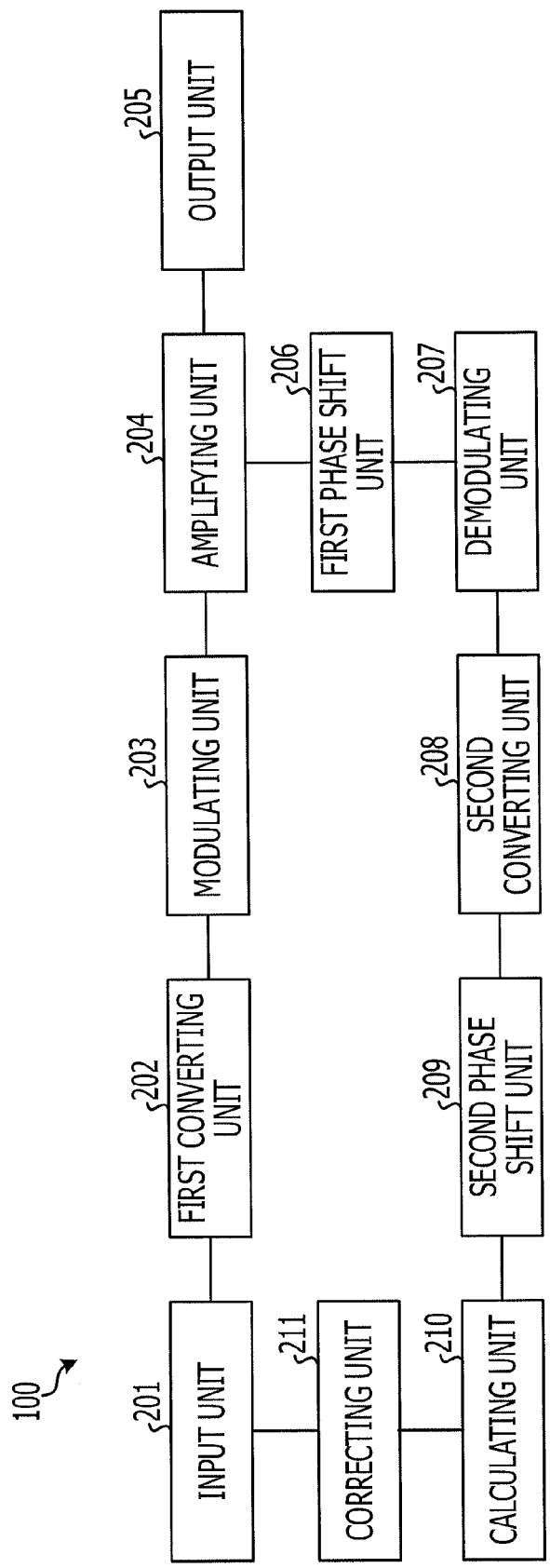
FIG. 2 is a block diagram of a functional configuration of the modulating device.

The following discusses an example of a functional configuration of the modulating device 100 with reference to FIG. 2.

FIG. 2 is a block diagram of a functional configuration of the modulating device 100. The modulating device 100 includes an input unit 201, a first converting unit 202, a modulating unit 203, an amplifying unit 204, an output unit 205, a first phase shift unit 206, a demodulating unit 207, a second converting unit 208, a second phase shift unit 209, a calculating unit 210, and a correcting unit 211.

<Example of Transmission-Side Functions>

An example of the transmission-side functions of the modulating device 100 will be discussed first. The input unit 201 inputs digital signals. A digital signal includes, for example, two baseband signals that indicate information to be transmitted. The two baseband signals include an in-phase (I) signal for indicating a real number part of the information to be transmitted, and a quadrature-phase (Q) signal for indicating an imaginary number part of the information to be transmitted. The two baseband signals may be represented together as a "signal representing one complex number". As a result, the first converting unit 202 is able to perform analog conversion on the signals input by the input unit 201.

The first converting unit 202 performs analog conversion on the signals input by the input unit 201. The first converting unit 202 uses, for example, a DAC to perform the analog conversion on the I-signal and the Q-signal input by the input unit 201. At this time, a DC offset produced in the first converting unit 202 is added to the I-signal and Q-signal input by the input unit 201. As a result, the modulating unit 203 is able to perform quadrature modulation on the signals having undergone analog conversion by the first converting unit 202.

The modulating unit 203 performs quadrature modulation on the signals converted by the first converting unit 202. The modulating unit 203 uses, for example, QMOD to perform quadrature modulation on two carrier waves that are orthogonal to each other, and produces one modulated wave for indicating the I-signal and the Q-signal converted by the first converting unit 202. As a result, the modulating unit 203 is able to produce a modulated wave to be transmitted from an antenna.

The amplifying unit 204 amplifies the signal having undergone quadrature modulation by the modulating unit 203. The amplifying unit 204 uses, for example, an amplifier to amplify the modulated wave having undergone quadrature modulation by the modulating unit 203. The amplifying unit 204 is able to amplify the modulated wave to be transmitted from the antenna.

The output unit 205 outputs the signal having undergone quadrature modulation by the modulating unit 203. The output unit 205 uses, for example, an antenna to transmit the modulated wave having undergone quadrature modulation by the modulating unit 203. The output unit 205 may output the signal amplified by the amplifying unit 204. The output unit 205 uses, for example, an antenna to transmit the modulated wave amplified by the amplifying unit 204. As a result, the modulating device 100 is able to transmit the signal.

<Example of Feedback-Side Functions>

A first example of the functions of the feedback-side will be discussed next. The first phase shift unit 206 performs phase rotation on a local signal by a phase shift quantity that changes periodically. The first phase shift unit 206 uses, for example, a complex multiplier to perform the phase rotation on the local signal that becomes a carrier wave. As a result, the demodulating unit 207 is able to perform phase rotation on the modulated wave.

In this case, the demodulating unit 207 uses the local signal that has undergone phase rotation by the first phase shift unit 206 to perform quadrature demodulation on the signal having undergone quadrature modulation by the modulating unit 203. The demodulating unit 207 uses, for example, QDEM to produce two signals that are orthogonal to each other and that have been phase-rotated by demodulating the modulated wave using the phase-rotated carrier wave. The demodulating unit 207 may perform quadrature demodulation on the signal amplified by the amplifying unit 204. As a result, the second converting unit 208 is able to perform digital conversion on the two signals produced by the demodulating unit 207.

The first phase shift unit 206 may perform phase rotation, by a phase shift quantity that changes periodically, on the signal having undergone quadrature modulation by the modulating unit 203. The first phase shift unit 206 uses, for example, a complex multiplier to perform the phase rotation on the modulated wave. The first phase shift unit 206 may perform phase rotation, by the phase shift quantity that changes periodically, on the signal amplified by the amplifying unit 204. As a result, the first phase shift unit 206 is able to perform phase rotation on the modulated wave.

In this case, the demodulating unit 207 uses the first phase shift unit 206 to perform quadrature demodulation on the signal having undergone phase rotation by the first phase shift unit 206. The demodulating unit 207 uses, for example, QDEM to produce two signals that are orthogonal to each other by performing quadrature demodulation on the modulated wave. As a result, the second converting unit 208 is able to perform digital conversion on the two signals produced by the demodulating unit 207.

The second converting unit 208 performs digital conversion on the signal having undergone quadrature demodulation by the demodulating unit 207. The second converting unit 208 uses, for example, ADC to perform digital conversion on each of the two signals produced by the demodulating unit 207. As a result, the second phase shift unit 209 is able to perform phase rotation on the signals having undergone digital conversion by the second converting unit 208.

The second phase shift unit 209 performs phase rotation, by a phase shift quantity in a direction opposite to the direction of the phase rotation performed by the first phase shift unit 206, on the signal converted by the second converting unit 208. The second phase shift unit 209 uses, for example, a complex multiplier to perform phase rotation, by the same phase shift quantity as the phase shift quantity of the phase rotation performed by the first phase shift unit 206, in the direction opposite to the direction of the phase rotation by the first phase shift unit 206. As a result, the second phase shift unit 209 is able to change the modulating unit offset b and the demodulating unit offset c into elements having different frequencies.

The calculating unit 210 calculates an amount of direct current offset produced in a signal from when the signal is input into the input unit 201 until the signal is input into the demodulating unit 207, by using the signal input into the input unit 201 and the signal converted by the second converting unit 208. The calculating unit 210 may calculate the amount of direct current offset produced in a signal from when the signal is input into the input unit 201 until the signal is input into the demodulating unit 207, by using the signal input into the input unit 201 and the signal having undergone phase rotation by the second phase shift unit 209.

The calculating unit 210 may calculate the amount of direct current offset produced in a signal from when the signal is input into the input unit 201 until the signal is input into the phase shift units, by using the signal input into the input unit 201 and the signal converted by the second converting unit 208. The calculating unit 210 may further calculate the amount of direct current offset produced in a signal from when the signal is input into the input unit 201 until the signal is input into the first phase shift unit 206, by using the signal input into the input unit 201 and the signal having undergone phase rotation by the second phase shift unit 209.

The calculating unit 210 obtains information indicating a relationship between, for example, the signal input by the input unit 201, a direct current offset produced in a signal from when the signal is input into the input unit 201 until the signal is input into the demodulating unit 207, a direct current offset produced in a signal from when the signal is input into the demodulating unit 207 until the signal is input into the calculating unit 201, and the signal converted by the second converting unit 208. Next, the calculating unit 210 obtains values of a signal input by the input unit 201 obtained at a plurality of points in time, and values of a signal converted by the second converting unit 208 obtained at a plurality of points in time. The calculating unit 210 uses the obtained information and the obtained values of the signals to calculate the amount of direct current offset produced in a signal from when the signal is input into the input unit 201 until the signal is input into the demodulating unit 207.

The calculating unit 210 may also calculate a value obtained by dividing, by periods of multiples, the results of an integration of a differential between the signal input by the input unit 201 and signal converted by the second converting unit 208, in periods of multiples of cycles of the changes in the phase shift quantities. As a result, the calculating unit 210 calculates the amount of direct current offset produced in the signal from when the signal is input into the input unit 201 until the signal is input into the demodulating unit 207.

The calculating unit 210 may also calculate the amount of direct current offset produced in a signal from when the signal is input into the input unit 201 until the signal is input into the demodulating unit 207, by using the signal input into the input unit 201 and the signal converted by the second converting unit 208. Moreover, the calculating unit 210 may calculate a correction coefficient corresponding to a distortion produced in the signal in the amplifying unit 204 by using the signal input by the input unit 201 and the signal converted by the second converting unit 208. The calculating unit 210 uses, for example, FPGA, to realize the above functions.

The correcting section 211 corrects the signal between the input unit 201 and the output unit 205 on the basis of the direct current offset amounts calculated by the calculating unit 210. The correcting section 211 uses, for example, a subtractor to correct the signal input into the input unit 201 by subtracting the direct current offset amounts calculated by the calculating unit 210 from the signal input into the input unit 201.

The correcting section 211 may also correct the signal between the input unit 201 and the output unit 205 on the basis of a correction coefficient and the direct current offset amounts calculated by the calculating unit 210. The correcting section 211 uses, for example, a DPD and a subtractor to correct the signal input into the input unit 201. As a result, the correcting section 211 is able to output a signal with high accuracy to the output unit 205.

A second example of functions on the feedback-side will be discussed. The operations by the second converting unit 208, the second phase shift unit 209, and the correcting section 211 are the same as those of the first example and will be omitted from the discussion of the second example.

The first phase shift unit 206 may perform phase rotation, by a phase shift quantity that changes periodically, on the signal having undergone quadrature modulation by the modulating unit 203. The first phase shift unit 206 uses, for example, a complex multiplier to perform the phase rotation on the modulated wave. The first phase shift unit 206 may perform phase rotation, by the phase shift quantity that changes periodically, on the signal amplified by the amplifying unit 204. As a result, the first phase shift unit 206 is able to perform phase rotation on the modulated wave.

The demodulating unit 207 performs quadrature demodulation on the signal having undergone phase rotation by the first phase shift unit 206. The demodulating unit 207 uses, for example, QDEM to produce two signals that are orthogonal to each other by performing quadrature demodulation on the modulated wave. As a result, the second converting unit 208 is able to perform digital conversion on the two signals produced by the demodulating unit 207.

The calculating unit 210 uses the information indicating a relationship between the signal input by the input unit 201, the direct current offset produced in the signal from when the signal is input into the input unit 201 until the signal is input into the first phase shift unit 206, the direct current offset produced in the signal from when the signal is input into the first phase shift unit 206 until the signal is input into the calculating unit 210, and the signal converted by the second converting unit 208, and the calculating unit 210 also uses the values of the signal input by the input unit 201 obtained at the plurality of points in time, and the values of the signal converted by the second converting unit 208 obtained at the plurality of points in time, to calculate the direct current offset amount produced in the signal from when the signal is input into the input unit 201 until the signal is input into the first phase shift unit 206.

The calculating unit 210 may also calculate the amount of direct current offset produced in the signal from when the signal is input into the input unit 201 until the signal is input into the first phase shift unit 206 by calculating the value obtained by dividing, by periods of multiples, the results of the integration of the differential between the signal input by the input unit 201 and signal converted by the second converting unit 208, in periods of multiples of cycles of the changes in the phase shift quantities.

The calculating unit 210 may further calculate the amount of direct current offset produced in a signal from when the signal is input into the input unit 201 until the signal is input into the first phase shift unit 206 and the correction coefficient corresponding to the distortion produced in the signals in the amplifying unit 204, by using the signal input into the input unit 201 and the signal having undergone phase rotation by the second phase shift unit 209.

First Embodiment of Modulating Device 100

Figure 3:
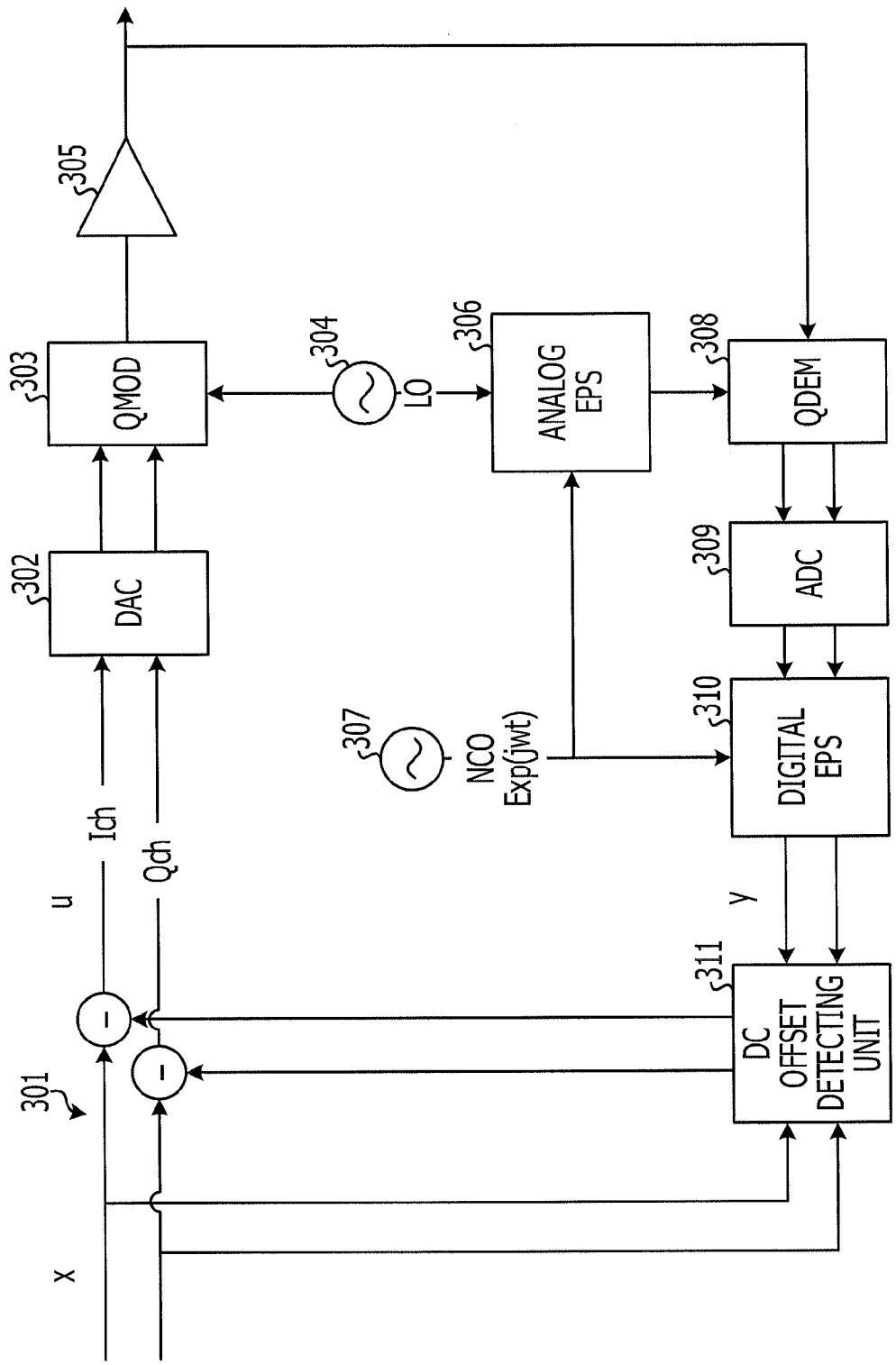
FIG. 3 illustrates a first embodiment of the modulating device.

FIG. 3 illustrates a first embodiment of the modulating device 100. As illustrated in FIG. 3, the modulating device 100 has two subtractors 301, a DAC 302, a QMOD 303, a first oscillator 304, an amplifier 305, an analog EPS 306, a second oscillator 307, a QDEM 308, an ADC 309, a digital EPS 310, and a DC offset detecting unit 311. A processing flow of the I-signal among the I-signals and the Q-signals will be discussed hereinbelow. The processing flow of the Q-signal is the same as the processing flow of the I-signal and will be omitted.

The two subtractors 301 are two-input one-output circuits that output, as an output signal, a subtraction result of the subtraction of one of the input signals from the other. In the example in FIG. 3, a signal line for inputting an I-signal that is a digital signal to be transmitted, a signal line for inputting a signal for correcting the I-signal from the DC offset detecting unit 311, and a signal line for outputting the signal to the DAC 302, are connected to one of the subtractors 301. Moreover, a signal line for inputting a Q-signal that is a digital signal to be transmitted, a signal line for inputting a signal for correcting the Q-signal from the DC offset detecting unit 311, and a signal line for outputting the signal to the DAC 302, are connected to the other one of the subtractors 301. In FIG. 3, the subtractors 301 subtract a compensation value b' of the modulating unit offset b input from the DC offset detecting unit 311, from an input I-signal x to be transmitted, and output the subtraction result u=x−b' to the DAC 302.

The DAC 302 is a two-input two-output circuit that performs analog conversion on the two digital signals that are input signals and outputs the analog-converted signals as two output signals. In the example in FIG. 3, signal lines for inputting the two digital signals from the subtractors 301, and signal lines for outputting the two signals to the QMOD 303 are connected to the DAC 302. In FIG. 3, the DAC 302 performs analog conversion on input digital signals u and outputs the analog-converted signals to the QMOD 303. The analog-converted signals may be referred to by "u" in the same way as the digital signals in the following explanation.

The QMOD 303 is a three-input one-output circuit that uses a local signal that is the remaining input signal to perform quadrature modulation on the analog signals that are the two input signals, and outputs the quadrature-modulated signal as an output signal. In the example in FIG. 3, two signal lines for inputting the two analog signals from the DAC 302, a signal line for inputting the local signal from the first oscillator 304, and a signal line for outputting the signal to the amplifier 305, are connected to the QMOD 303. In FIG. 3, the QMOD 303 uses the local signal from the first oscillator 304 to perform quadrature modulation on the input signal u, and outputs the quadrature-modulated signal to the amplifier 305. The modulating unit offset b is added to the signal u by passing through the DAC 302 and the QMOD 303, to become the signal u+b.

The first oscillator 304 is a one-output circuit that outputs a local signal as an output signal. In the example in FIG. 3, a signal line for outputting the local signal to the QMOD 303, and a signal line for outputting the local signal to the analog EPS 306, are connected to the first oscillator 304. In FIG. 3, the first oscillator 304 branches one output of the local signal to output the local signal to the QMOD 303 and to the analog EPS 306.

The amplifier 305 is a one-input one-output circuit that amplifies an analog signal that is an input signal and outputs the amplified signal as an output signal. In the example in FIG. 3, a signal line for inputting the analog signal from the first oscillator 304, a signal line for outputting the signal to the QDEM 308, and a signal line for outputting the signal to the antenna, are connected to the amplifier 305. In FIG. 3, the amplifier 305 outputs, to the antenna and to the QDEM 308 by branching, a one-output signal that is a quadrature-modulated signal that has been amplified. For simplification at this time, the amplifier 305 amplifies the signal by one.

The analog EPS 306 is a two-input one-output circuit that performs phase rotation on a local signal that is one of the input signals by using a signal that is phase-rotated by a phase shift quantity that changes periodically and that is the other input signal, and outputs the phase-rotated signal as an output signal. In the following discussion, a signal that is phase-rotated by a phase shift quantity that changes periodically may be referred to as a "phase shift signal". In the example in FIG. 3, a signal line for inputting the local signal from the first oscillator 304, a signal line for inputting the phase shift signal from the second oscillator 307, and a signal line for outputting the signal to the QDEM 308 are connected to the analog EPS 306. In FIG. 3, the analog EPS 306 uses the phase shift signal to perform phase rotation on the local signal from the first oscillator 304, and outputs the phase-rotated signal to the QDEM 308.

The second oscillator 307 is a one-output circuit that outputs the phase shift signal as an output signal. In the example in FIG. 3, a signal line for outputting the phase shift signal to the analog EPS 306 and a signal line for outputting the phase shift signal to the digital EPS 310 are connected to the second oscillator 307. In FIG. 3, the second oscillator 307 outputs by branching one output phase shift signal to the analog EPS 306 and one output phase shift to the digital EPS 310.

The QDEM 308 is a two-input two-output circuit that uses the local signal that is phase-rotated by the phase shift signal that is one of the input signals to perform quadrature demodulation on an analog signal that is the other of the input signals, and outputs the quadrature-demodulated signal as an output signal. In the example in FIG. 3, a signal line for inputting the signal from the amplifier 305, a signal line for inputting the signal from the analog EPS 306, and a signal line for outputting the signal to the ADC 309 are connected to the QDEM 308. In FIG. 3, the QDEM 308 uses the signals from the analog EPS 306 to perform quadrature demodulation on the analog signal from the amplifier 305, and outputs the signal $(u+b)*EXP(jwt)$ to the ADC 309.

The ADC 309 is a two-input two-output circuit that performs digital conversion on the two analog signals that are input signals and outputs the digital-converted signals as two output signals. In the example in FIG. 3, a signal line for inputting the two signals from the QDEM 308 and a signal line for outputting the signals to the digital EPS 310 are connected to the ADC 309. In FIG. 3, the ADC 309 performs digital conversion on the signal $(u+b)*EXP(jwt)$ input from the QDEM 308, and outputs the digitally converted signal to the digital EPS 310. The demodulating unit offset c is added to the signal $(u+b)*EXP(jwt)$ that passes through the QDEM 308 and the ADC 309 to become the signal $(u+b)*EXP(jwt)+c$.

The digital EPS 310 is a three-input two-output circuit that uses the phase shift signal that is the remaining input signal to perform phase rotation on the two signals that are the input signals, and outputs the phase-rotated signal as an output signal. In the example in FIG. 3, a signal line for inputting the two signals from the ADC 309, a signal line for inputting the phase shift signal from the second oscillator 307, and a signal line for outputting the signal to the DC offset detecting unit 311, are connected to the digital EPS 310. In FIG. 3, the digital EPS 310 uses the phase shift signal from the second oscillator 307 to perform phase rotation, by a phase shift quantity that is the same as that of the phase rotation performed by the analog EPS 306, on the two input signals in a direction opposite the direction of the phase rotation by the analog EPS 306. The digital EPS 310 outputs the phase-rotated signal $(u+b)+c*EXP(jwt)*$ to the DC offset detecting unit 311 as the feedback signal y.

The DC offset detecting unit 311 is a four-input two-output circuit that uses two feedback signals that are input signals and two digital signals to be transmitted that are input signals, to output the compensation value b' signal of the modulating unit offset b. In the example in FIG. 3, a signal line for inputting the two feedback signals from the digital EPS 310, a signal line for inputting the two digital signals that are to be transmitted, and a signal line for outputting the signal to the subtractor 301 are connected to the DC offset detecting unit 311. In FIG. 3, the DC offset detecting unit 311 produces the compensation value b' signal of the modulating unit offset b for correcting the two digital signals to be transmitted and outputs the compensation value b' signal to the two subtractors 310 as described below with reference to FIG. 4.

As a result, the signal input to the amplifier 305 becomes the signal $u+b=u-b'+b\approx u$ due to the DC offset detecting unit 311 inputting the compensation value b' that becomes the same value as the modulating unit offset b into the subtractors 301. Therefore, the modulating device 100 is able to remove the modulating unit offset b from the signal to be amplified and transmitted by the amplifier 305 and transmit a signal with high accuracy.

(Correction of Signals in First Embodiment)

Figure 4:
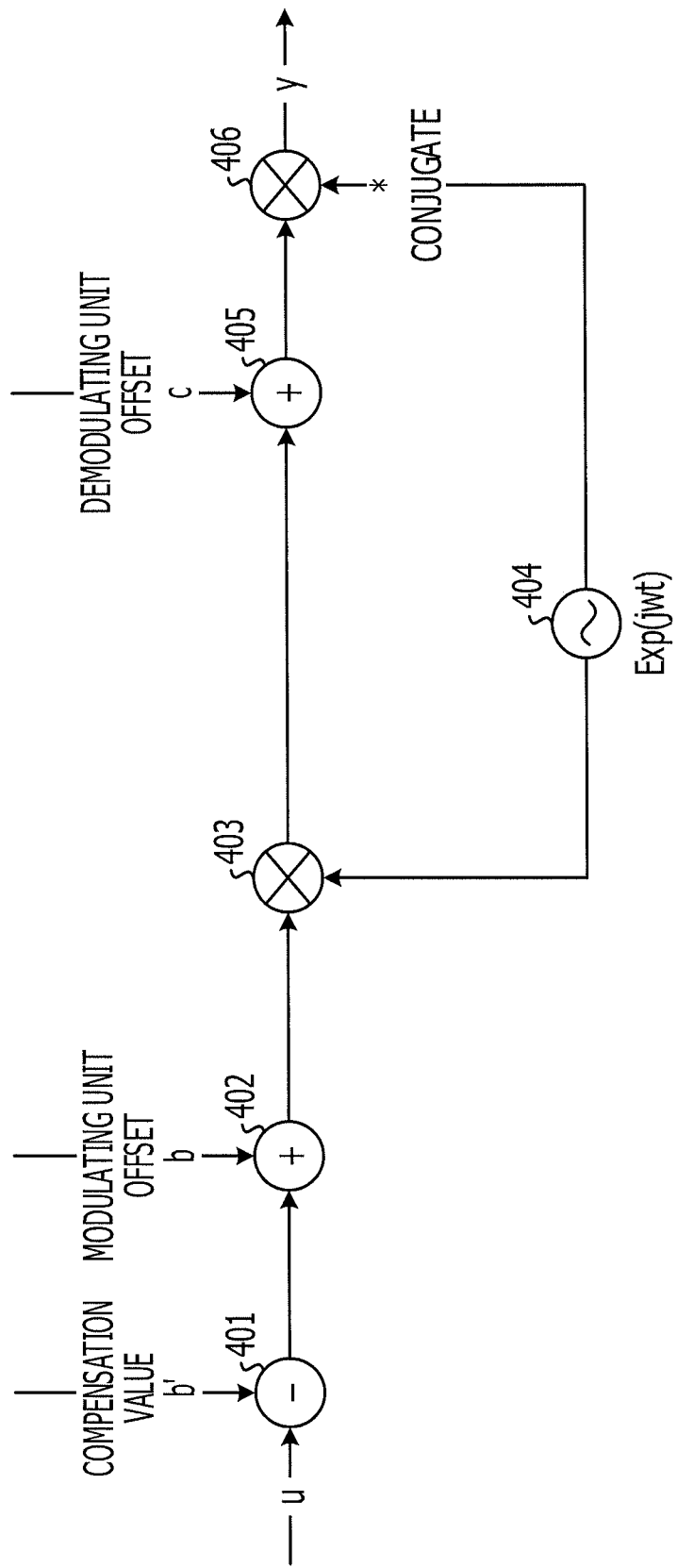
FIG. 4 illustrates a correction of a signal according to the first embodiment.

FIG. 4 illustrates a correction of a signal according to the seventh embodiment. FIG. 4 illustrates the flow of a signal xi until the signal $x_i$ becomes a feedback signal $y_i$ in the circuit illustrated in FIG. 3.

In the circuit illustrated in FIG. 3, the compensation value b' of the modulating unit offset b as indicated by reference numeral 401 is subtracted from the signal $x_i$, and the modulating unit offset b as indicated by the reference numeral 402 is added to the signal $x_i$. Further, the signal $x_i$ is phase-rotated, as indicated by reference numeral 403, using the phase shift signal indicated by reference numeral 404, and the demodulating unit offset c is added to the signal $x_i$ as indicated by reference numeral 405. Further, as indicated by reference numeral 406, the signal $x_i$ is phase-rotated in the direction opposite to that of the phase rotation indicated by reference numeral 403, using the phase shift signal indicated by reference numeral 404.

As a result, the signal $x_i$ is fed back as the feedback signal $y_i$. In this case, the signal becomes $u_i=x_i-b'$. Therefore, an error $\epsilon_i$ between the feedback signal $y_i$ theoretically calculated from the signal $u_i$ and the actually measured feedback signal $y_i$ in the circuit illustrated in FIG. 3 is expressed by the following equation (1). Here, 1 to n are natural numbers. "a" is a coefficient for indicating the level of amplification of the signal $u_i$ performed by the amplifier 305. "b" indicates the modulating unit offset. "c" indicates the demodulating unit offset. "$e^{-jwt}$" indicates the phase rotation.

$$au_i + b + c \times e^{-jwt} - y_i = \epsilon_i \tag{1}$$

The DC offset detecting unit 311 produces the signal for the compensation value b' of the modulating unit offset b by using the signal $x_i$ in a period I of one cycle of $e^{-jwt}$ and the feedback signal $y_i$ to apply the least-squares method in the above equation (1). In this case, the DC offset detecting unit 311 applies the least-squares method in the above equation (1) to calculate the coefficient "a", the coefficient "b", and the coefficient "c" when the error $\epsilon_i$ in the following equation (2) is the smallest.

$$\sum_{i=1}^{n} [(au_i + b + c \times e^{-jwt} - y_i)(au_i + b + c \times e^{-jwt} - y_i)^*] = \sum_{i=1}^{n} |\epsilon_i|^2 \tag{2}$$

The error $\epsilon_i$ in the above equation (2) becomes the smallest when the following equations (3) to (5) that are equations differentiated from the above equation (2) become 0.

$$\sum_{i=1}^{n} [u_i^*(au_i + b + c \times e^{-jwt} - y_i)] = 0 \tag{3}$$

$$\sum_{i=1}^{n} [(au_i + b + c \times e^{-jwt} - y_i)] = 0 \tag{4}$$

$$\sum_{i=1}^{n} [e^{jwt}(au_i + b + c \times e^{-jwt} - y_i)] = 0 \tag{5}$$

The following equation (6) is obtained when the above equations (3) to (5) are expressed as a matrix.

$$\begin{bmatrix} \sum_{i=1}^{n} |u_i|^2 & \sum_{i=1}^{n} u_i^* & \sum_{i=1}^{n} u_i^* e^{-jwt} \\ \sum_{i=1}^{n} u_i & n & \sum_{i=1}^{n} e^{-jwt} \\ \sum_{i=1}^{n} u_i e^{jwt} & \sum_{i=1}^{n} e^{jwt} & n \end{bmatrix} \begin{bmatrix} a \\ b \\ c \end{bmatrix} = \begin{bmatrix} \sum_{i=1}^{n} y_i u_i^* \\ \sum_{i=1}^{n} y_i \\ \sum_{i=1}^{n} y_i e^{jwt} \end{bmatrix} \tag{6}$$

The following equation (7) is obtained when the above equation (6) is transformed.

$$\begin{bmatrix} a \\ b \\ c \end{bmatrix} = \begin{bmatrix} \sum_{i=1}^{n} |u_i|^2 & \sum_{i=1}^{n} u_i^* & \sum_{i=1}^{n} u_i^* e^{-jwt} \\ \sum_{i=1}^{n} u_i & n & \sum_{i=1}^{n} e^{-jwt} \\ \sum_{i=1}^{n} u_i e^{jwt} & \sum_{i=1}^{n} e^{jwt} & n \end{bmatrix}^{-1} \begin{bmatrix} \sum_{i=1}^{n} y_i u_i^* \\ \sum_{i=1}^{n} y_i \\ \sum_{i=1}^{n} y_i e^{jwt} \end{bmatrix} \tag{7}$$

In this case, the DC offset detecting unit 311 calculates the modulating unit offset b by substituting the signal $u_i$ calculated from the digital signal $x_i$ that is to be transmitted in a period I of one cycle, and the feedback signal $y_i$ in a period I of one cycle, into the above equation (7). The DC offset detecting unit 311 then outputs the calculated modulating unit offset b as the compensation value b' of the modulating unit offset b to the subtractors 301.

The DC offset detecting unit 311 may output, as the compensation value b', a value obtained by dividing the modulating unit offset b by the level of amplification a of the amplifier 305 when the calculated modulating unit offset b is a value amplified by the amplifier 305.

The error $\epsilon_i$ between the feedback signal $y_i$ theoretically calculated from the signal $u_i$ and the actually measured feedback signal $y_i$ in the circuit illustrated in FIG. 3 is expressed by the following equation (8). Therefore, the DC offset detecting unit 311 may calculate the modulating unit offset b by using an integral operator using the signal $u_i$ calculated from the signal $x_i$ in the period I of one cycle of $e^{-jwt}$, and the feedback signal $y_i$ in the period I of one cycle.

$$ax + b + c \times e^{-jwt} - y = \epsilon \tag{8}$$

The following equation (9) is obtained when the above equation (8) is integrated.

$$\sum_{j=1}^{1} (ax_j + b + c \times e^{-jwt} - y_j) = \sum_{j=1}^{1} \epsilon_j \tag{9}$$

The following equation (10) is obtained when the above equation (9) is expanded.

$$a \sum_{j=1}^{1} (x_j) + 1b - \sum_{j=1}^{1} (y_j) = \sum_{j=1}^{1} \epsilon_j \tag{10}$$

The following equation (14) is obtained when the following equations (11) to (13) are used to transpose the above equation (10).

$$a \sum_{j=1}^{l} (x_j) = X \tag{11}$$

$$\sum_{j=1}^{l} (y_j) = X \tag{12}$$

$$\sum_{j=1}^{l} \epsilon_j = E \tag{13}$$

$$aX_i + 1b - Y_i = E_i \tag{14}$$

In this case, the DC offset detecting unit 311 applies the least-squares method in the above equation (14) to calculate the coefficient "a" and the coefficient "b" when an error $E_i$ in the following equation (15) is the smallest.

$$\sum_{i=1}^{n} [(aX_i + 1b - Y)(aX_i + 1b - Y)^*] = \sum_{i=1}^{n} |E_i|^2 \tag{15}$$

The error in the above equation (15) becomes the smallest when the following equations (16) and (17) that are equations differentiated from the above equation (15) become 0.

$$\sum_{i=1}^{n} [X_i^*(aX_i + 1b - Y_i)] = 0 \quad (16)$$

$$\sum_{i=1}^{n} [1(aX_i + 1b - Y_i)] = 0 \quad (17)$$

The following equation (18) is obtained when the above equations (16) and (17) are expressed as a matrix.

$$\begin{bmatrix} \sum_{i=1}^{n} |X_i|^2 & n1 \\ 1\sum_{i=1}^{n} X_i & n1 \end{bmatrix} \begin{bmatrix} a \\ b \end{bmatrix} = \begin{bmatrix} \sum_{i=1}^{n} Y_i X_i^* \\ 1\sum_{i=1}^{n} Y_i^* \end{bmatrix} \quad (18)$$

The following equation (19) is obtained when the above equation (18) is transformed.

$$\begin{bmatrix} a \\ b \end{bmatrix} = \begin{bmatrix} \sum_{i=1}^{n} |X_i|^2 & n1 \\ 1\sum_{i=1}^{n} X_i & n1 \end{bmatrix}^{-1} \begin{bmatrix} \sum_{i=1}^{n} Y_i X_i^* \\ 1\sum_{i=1}^{n} Y_i^* \end{bmatrix} \quad (19)$$

In this case, the DC offset detecting unit 311 calculates the modulating unit offset b by substituting the digital signal $u_i$ to be transmitted and the input feedback signal $y_i$, into the above equation (19). The DC offset detecting unit 311 then outputs the calculated modulating unit offset b as the compensation value b' of the modulating unit offset b to the subtractors 301.

Second Embodiment of Modulating Device 100

Figure 5:
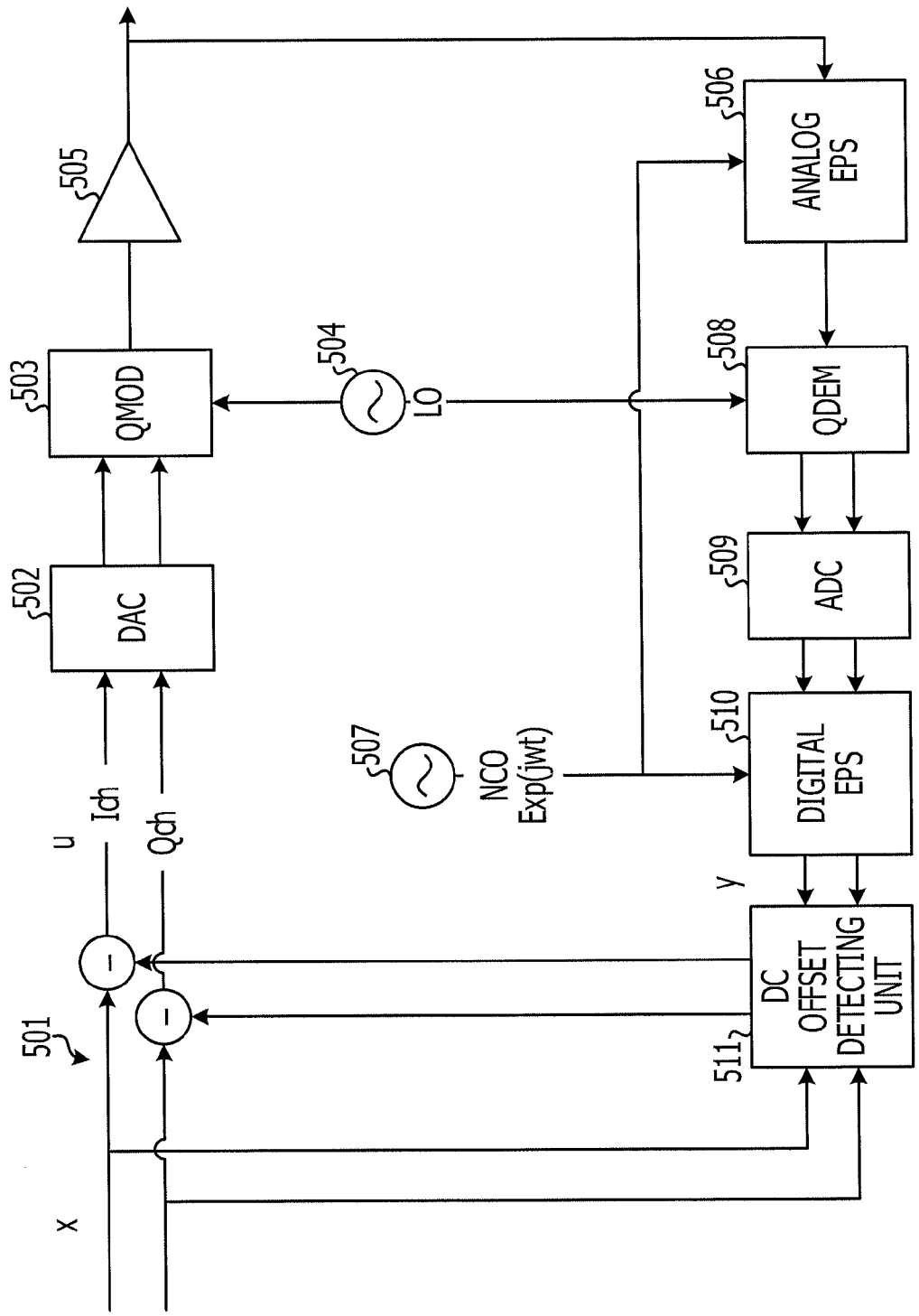
FIG. 5 illustrates a second embodiment of the modulating device.

FIG. 5 illustrates a second embodiment of the modulating device 100. As illustrated in FIG. 5, the modulating device 100 has two subtractors 501, a DAC 502, a QMOD 503, a first oscillator 504, an amplifier 505, an analog EPS 506, a second oscillator 507, a QDEM 508, an ADC 509, a digital EPS 510, and a DC offset detecting unit 511 in the same way as illustrated in FIG. 3. A processing flow of the I-signal among the I-signals and the Q-signals will be discussed hereinbelow. The processing flow of the Q-signal is the same as the processing flow of the I-signal and will be omitted.

The two subtractors 501 are circuits that are similar to the two subtractors 301 illustrated in FIG. 3 and thus an explanation will be omitted. The DAC 502 is a circuit similar to the DAC 302 illustrated in FIG. 3 and thus an explanation will be omitted. The QMOD 503 is a circuit similar to the QMOD 303 illustrated in FIG. 3 and thus an explanation will be omitted. The modulating unit offset b is added to the signal u by passing through the DAC 502 and the QMOD 503, to become the signal u+b.

The first oscillator 504 is a one-output circuit that outputs a local signal as an output signal. In the example illustrated in FIG. 5, a signal line for outputting the local signal to the QMOD 503 and a signal line for outputting the local signal to the QDEM 508 are connected to the first oscillator 504. In FIG. 5, the first oscillator 504 branches the one output of the local signal to the QMOD 503 and to the QDEM 508.

The amplifier 505 is a one-input one-output circuit that amplifies the analog signal that is the input signal and outputs the amplified signal as an output signal. In the example in FIG. 5, a signal line for inputting the analog signal from the first oscillator 504, a signal line for outputting the signal to the analog EPS 506, and a signal line for outputting the signal to the antenna, are connected to the amplifier 505. In FIG. 5, the amplifier 505 outputs, to the antenna and to the analog EPS 506 by branching, the one-output signal that is the quadrature-modulated signal that has been amplified.

The analog EPS 506 is a two-input one-output circuit that performs phase rotation on the signal from the amplifier 505 that is one of the input signals by using the phase shift signal from the second oscillator 507 that is the other input signal, and outputs the phase-rotated signal as an output signal. In the example illustrated in FIG. 5, a signal line for inputting the signal from the amplifier 505, a signal line for inputting the phase shift signal from the second oscillator 507, and a signal line for outputting the signal to the QDEM 508 are connected to the analog EPS 506. In FIG. 5, the analog EPS 506 uses the phase shift signal to perform phase rotation on the signal from the amplifier 505, and outputs the phase-rotated signal to the QDEM 508. The second oscillator 507 is a circuit similar to the second oscillator 307 illustrated in FIG. 3 and thus an explanation will be omitted.

The QDEM 508 is a two-input two-output circuit that uses the local signal that is one of the input signals to perform quadrature demodulation on the analog signal that is the other of the input signals, and outputs the quadrature-demodulated signal as an output signal. In the example in FIG. 5, a signal line for inputting the signal from the analog EPS 506, a signal line for inputting the local signal from the first oscillator 504, and a signal line for outputting the signal to the ADC 509, are connected to the QDEM 508. In FIG. 5, the QDEM 508 uses the local signal from the first oscillator 504 to perform quadrature demodulation on the analog signal from the analog EPS 506 to output the signal (u+b)*EXP(jwt) to the ADC 509.

The ADC 509 is a circuit similar to the ADC 309 illustrated in FIG. 3 and thus an explanation will be omitted. The demodulating unit offset c is added to the signal (u+b)*EXP (jwt) that passes through the QDEM 508 and the ADC 509 to become the signal (u+b)*EXP(jwt)+c. The digital EPS 510 is a circuit similar to the digital EPS 310 illustrated in FIG. 3 and thus an explanation will be omitted. The DC offset detecting unit 511 is a circuit similar to the DC offset detecting unit 311 illustrated in FIG. 3 and thus an explanation will be omitted.

As a result, the signal input into the amplifier 505 due to the DC offset detecting unit 511 inputting the compensation value b' that is the same value as the modulating unit offset b into the subtractors 501, becomes the signal u+b=u−b'+b≈u. Therefore, the modulating device 100 is able to remove the modulating unit offset b from the signal to be amplified and transmitted by the amplifier 505 and is able to transmit a signal with high accuracy.

(Correction of Signals in Second Embodiment)

In the circuits illustrated in FIG. 5, the compensation value b' of the modulating unit offset b is subtracted from the signal $x_i$, the modulating unit offset b is added to the signal $x_i$ and then the signal $x_i$ is phase-rotated in the same way as illustrated in FIG. 4. The demodulating unit offset c is then added to the signal $x_i$ and the signal $x_i$ is phase-rotated in the opposite direction to be then fed back as the feedback signal $y_i$. Therefore, the DC offset detecting unit 511 in the circuits illustrated in FIG. 5 calculates the modulating unit offset b and outputs the modulating unit offset b to the subtractors 501 as the compensation value b' of the modulating unit offset b in the same way as illustrated in FIG. 4.

Third Embodiment of Modulating Device 100

Figure 6:
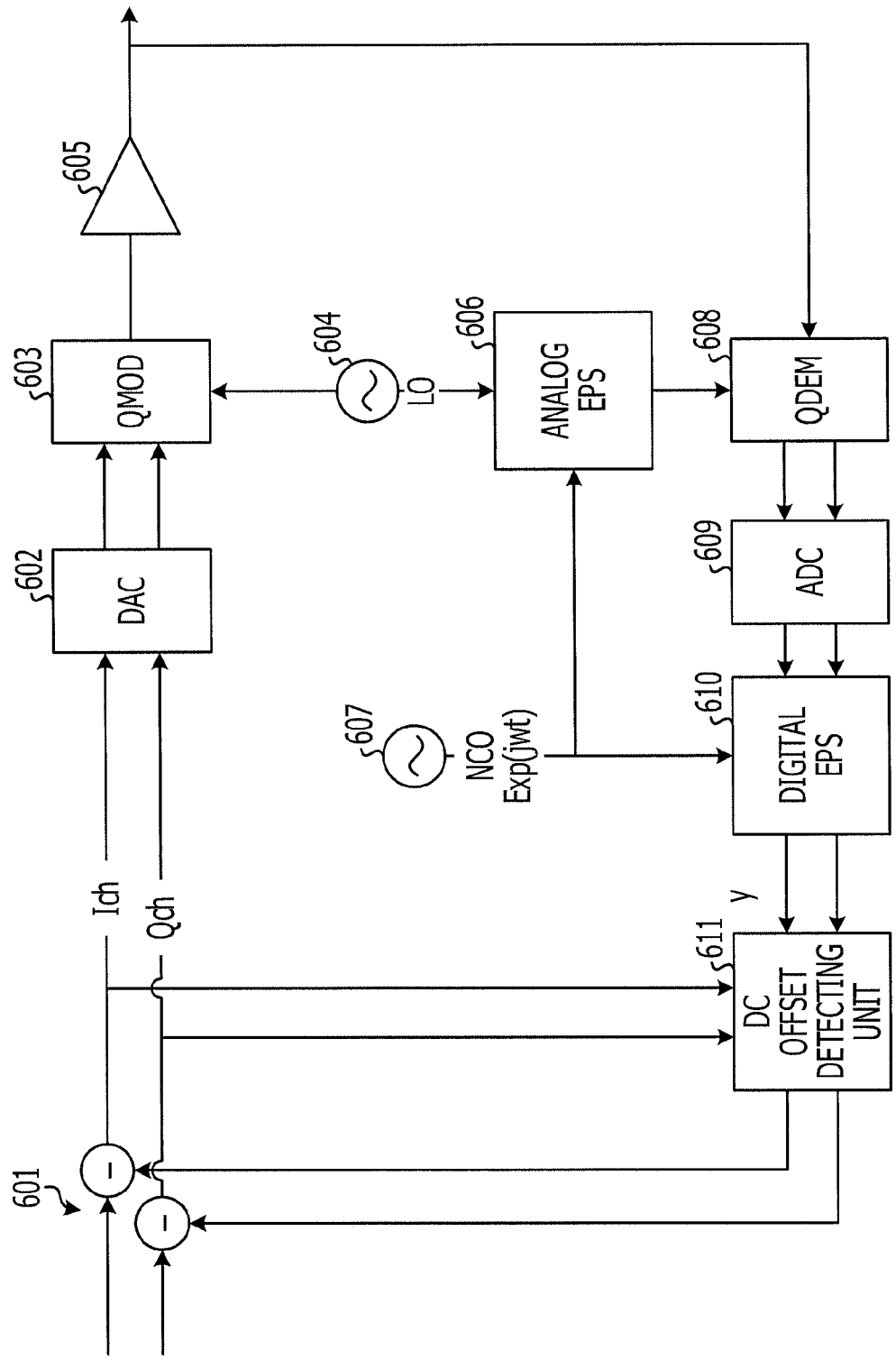
FIG. 6 illustrates a third embodiment of the modulating device.

FIG. 6 illustrates a third embodiment of the modulating device 100. The third embodiment is a modified example of the first embodiment.

As illustrated in FIG. 6, the modulating device 100 has two subtractors 601, a DAC 602, a QMOD 603, a first oscillator 604, an amplifier 605, an analog EPS 606, a second oscillator 607, a QDEM 608, an ADC 609, a digital EPS 610, and a DC offset detecting unit 611. A processing flow of the I-signal among the I-signals and the Q-signals will be discussed hereinbelow. The processing flow of the Q-signal is the same as the processing flow of the I-signal and will be omitted.

The two subtractors 601 are two-input one-output circuits that output, as an output signal, a subtraction result of the subtraction of one of the input signals from the other. In the example in FIG. 6, a signal line for inputting the digital I-signal to be transmitted and a signal line for inputting the signal for correcting the I-signal from the DC offset detecting unit 611 are connected to one of the subtractors 601. A signal line for outputting a signal to the DAC 602 and to the DC offset detecting unit 611 is connected to the other subtractor 601.

A signal line for inputting the Q-signal that is the digital signal to be transmitted and a signal line for inputting the signal for correcting the Q-signal from the DC offset detecting unit 611 are connected to the other subtractor 601. A signal line for outputting the signal to the DAC 602 and to the DC offset detecting unit 611 is connected to the other subtractor 601. In FIG. 6, the subtractors 601 subtract the compensation value b' of the modulating unit offset b input from the DC offset detecting unit 611, from the input I-signal x to be transmitted, and branch and output the subtraction result u=x−b' to the DAC 602 and to the DC offset detecting unit 611.

The DAC 602 is a circuit similar to the DAC 302 illustrated in FIG. 3 and thus an explanation will be omitted. The QMOD 603 is a circuit similar to the QMOD 303 illustrated in FIG. 3 and thus an explanation will be omitted. The first oscillator 604 is a circuit similar to the first oscillator 304 illustrated in FIG. 3 and thus an explanation will be omitted. The amplifier 605 is a circuit similar to the amplifier 305 illustrated in FIG. 3 and thus an explanation will be omitted. The analog EPS 606 is a circuit similar to the analog EPS 306 illustrated in FIG. 3 and thus an explanation will be omitted.

The second oscillator 607 is a circuit similar to the second oscillator 307 illustrated in FIG. 3 and thus an explanation will be omitted. The QDEM 608 is a circuit similar to the QDEM 308 illustrated in FIG. 3 and thus an explanation will be omitted. The ADC 609 is a circuit similar to the ADC 309 illustrated in FIG. 3, and thus an explanation will be omitted. The digital EPS 610 is a circuit similar to the digital EPS 310 illustrated in FIG. 3 and thus an explanation will be omitted.

The DC offset detecting unit 611 is a four-input two-output circuit that uses two feedback signals that are input signals from the digital EPS 610 and two signals from the subtractors 601 that are input signals, to output the compensation value b' signal of the modulating unit offset b. In the example in FIG. 6, a signal line for inputting the two feedback signals from the digital EPS 610, a signal line for inputting the two signals from the subtractors 601, and a signal line for outputting the signals to the subtractors 601 are connected to the DC offset detecting unit 611. In FIG. 6, the DC offset detecting unit 611 produces the compensation value b' signal of the modulating unit offset b for correcting the two signals to be transmitted and outputs the compensation value b' signal to the two subtractors 601 as described below with reference to FIG. 7.

As a result, the signal input to the amplifier 605 becomes the signal u+b=u−b'+b≈u due to the DC offset detecting unit 611 inputting the compensation value b' that becomes the same value as the modulating unit offset b into the subtractors 601. Therefore, the modulating device 100 is able to remove the modulating unit offset b from the signal to be amplified and transmitted by the amplifier 605 and is able to transmit a signal with high accuracy.

(Correction of Signals in Third Embodiment)

Figure 7:
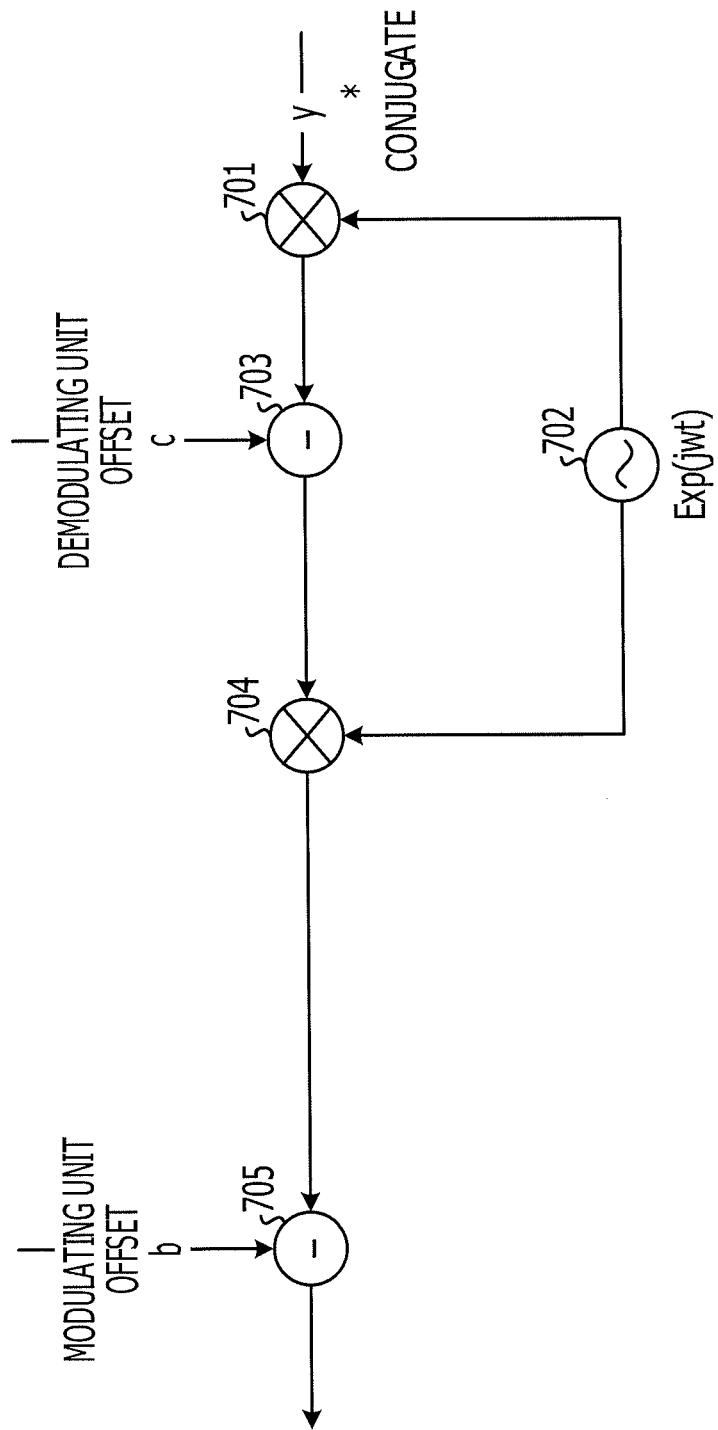
FIG. 7 illustrates a correction of a signal according to the third embodiment.

FIG. 7 illustrates the correction of a signal according to the third embodiment. FIG. 7 follows a direction reverse to the flow of the signal and illustrates a flow of the feedback signal $y_i$ being returned to the signal $x_i$ in the circuits in FIG. 6.

In the circuits in FIG. 6, the feedback signal $y_i$ is phase-rotated, as indicated by the reference numeral 701, by using the phase shift signal indicated by the reference numeral 702, and the demodulating unit offset c is subtracted from the feedback signal $y_i$ as indicated by the reference numeral 703. Further, as indicated by reference numeral 704, the feedback signal $y_i$ is phase-rotated in the direction opposite to that of the phase rotation indicated by reference numeral 701, using the phase shift signal indicated by reference numeral 702, and the modulating unit offset b is subtracted as indicated by the reference numeral 705. As a result, the feedback signal $y_i$ is returned to the signal $u_i$. Therefore, in the circuits illustrated in FIG. 6, an error $\epsilon_i$ between the signal $u_i$ theoretically calculated from the feedback signal $y_i$ and the actually measured signal $u_i$ is expressed by the following equation (20).

$$ay_i + b + c \times e^{-jwt} - u_i = \epsilon_i \quad (20)$$

The DC offset detecting unit 611 produces the signal for the compensation value b' of the modulating unit offset b by using the signal $x_i$ and the feedback signal $y_i$ in a period I of one cycle of $e^{-jwt}$ to apply the least-squares method in the above equation (20). In this case, the DC offset detecting unit 611 applies the least-squares method in the above equation (20) to calculate the coefficient "a", the coefficient "b", and the coefficient "c" when the error $\epsilon_i$ in the following equation (21) is the smallest.

$$\sum_{i=1}^{n} [(ay_i + b + c \times e^{jwt} - u_i)(ay_i + b + c \times e^{jwt} - u_i)^*] = \sum_{i=1}^{n} |\epsilon_i|^2 \quad (21)$$

The error $\epsilon_i$ in the above equation (21) becomes the smallest when the following equations (22) to (24) that are equations differentiated from the above equation (21) become 0.

$$\sum_{i=1}^{n} [y_i^*(ay_i + b + c \times e^{jwt} - u_i)] = 0 \quad (22)$$

$$\sum_{i=1}^{n} [(ay_i + b + c \times e^{jwt} - u_i)] = 0 \quad (23)$$

$$\sum_{i=1}^{n} [e^{-jwt}(ay_i + b + c \times e^{jwt} - u_i)] = 0 \quad (24)$$

The following equation (25) is obtained when the above equations (22) to (24) are expressed as a matrix.

$$\begin{bmatrix} \sum_{i=1}^{n} |y_i|^2 & \sum_{i=1}^{n} y_i^* & \sum_{i=1}^{n} y_i^* e^{jwt} \\ \sum_{i=1}^{n} y_i & n & \sum_{i=1}^{n} e^{jwt} \\ \sum_{i=1}^{n} y_i e^{-jwt} & \sum_{i=1}^{n} e^{-jwt} & n \end{bmatrix} \begin{bmatrix} a \\ b \\ c \end{bmatrix} = \begin{bmatrix} \sum_{i=1}^{n} u_i y_i^* \\ \sum_{i=1}^{n} u_i \\ \sum_{i=1}^{n} u_i e^{-jwt} \end{bmatrix} \quad (25)$$

The following equation (26) is obtained when the above equation (25) is transformed.

$$\begin{bmatrix} a \\ b \\ c \end{bmatrix} = \begin{bmatrix} \sum_{i=1}^{n} |y_i|^2 & \sum_{i=1}^{n} y_i^* & \sum_{i=1}^{n} y_i^* e^{jwt} \\ \sum_{i=1}^{n} y_i & n & \sum_{i=1}^{n} e^{jwt} \\ \sum_{i=1}^{n} y_i e^{-jwt} & \sum_{i=1}^{n} e^{-jwt} & n \end{bmatrix}^{-1} \begin{bmatrix} \sum_{i=1}^{n} u_i y_i^* \\ \sum_{i=1}^{n} u_i \\ \sum_{i=1}^{n} u_i e^{-jwt} \end{bmatrix} \quad (26)$$

In this case, the DC offset detecting unit 611 calculates the modulating unit offset b by substituting the digital signal $u_i$ in a period I of one cycle, and the feedback signal $y_i$ in a period I of one cycle, into the above equation (26). The DC offset detecting unit 611 then outputs the calculated modulating unit offset b as the compensation value b' of the modulating unit offset b to the subtractors 601.

Fourth Embodiment of Modulating Device 100

Figure 8:
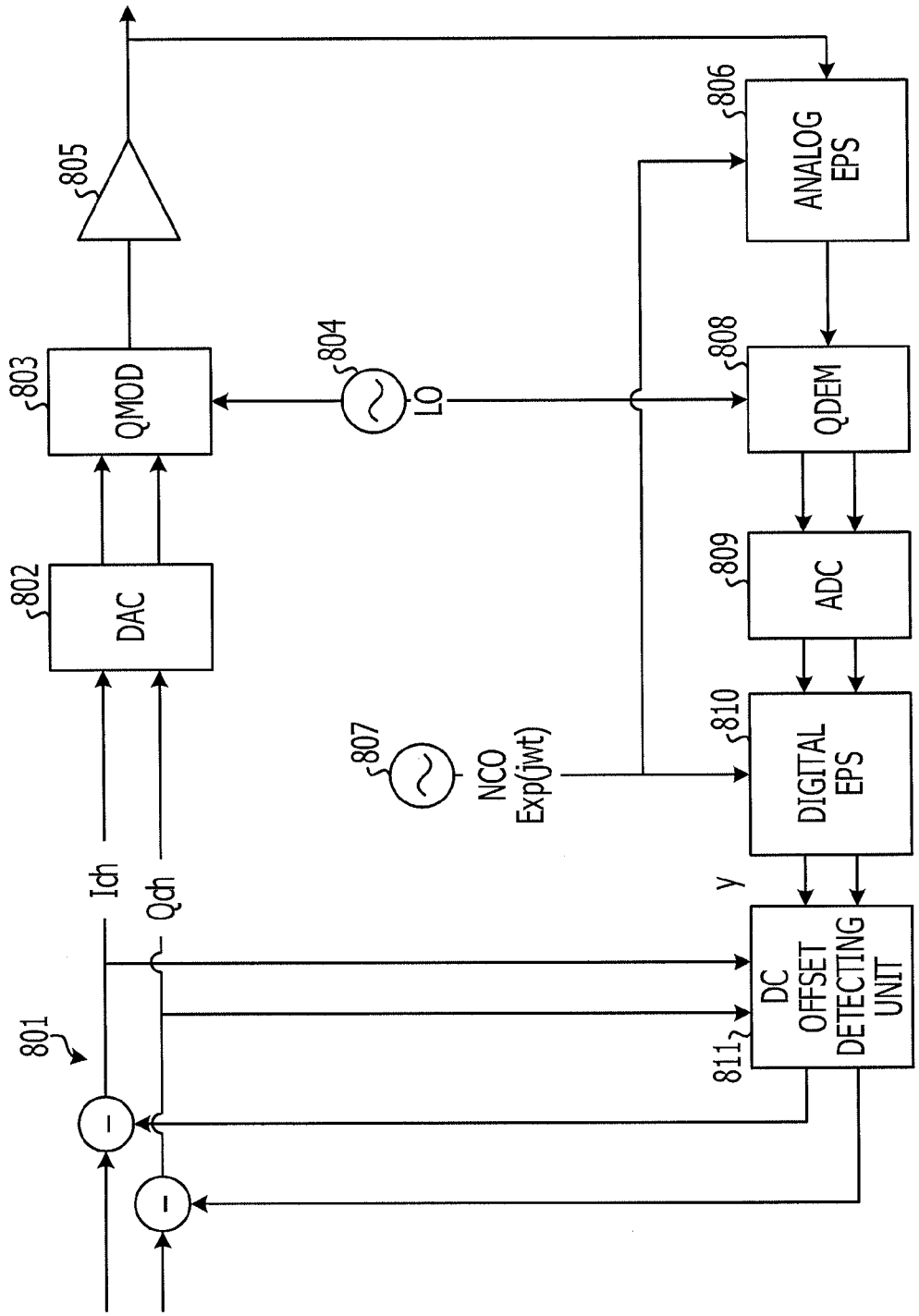
FIG. 8 illustrates a fourth embodiment of the modulating device.

FIG. 8 illustrates a fourth embodiment of the modulating device 100. The fourth embodiment is a modified example of the second embodiment.

As illustrated in FIG. 8, the modulating device 100 has two subtractors 801, a DAC 802, a QMOD 803, a first oscillator 804, an amplifier 805, an analog EPS 806, a second oscillator 807, a QDEM 808, an ADC 809, a digital EPS 810, and a DC offset detecting unit 811, in the same way as FIG. 5. A processing flow of the I-signal among the I-signals and the Q-signals will be discussed hereinbelow. The processing flow of the Q-signal is the same as the processing flow of the I-signal and thus an explanation will be omitted.

The two subtractors 801 are two-input one-output circuits that output, as an output signal, a subtraction result of the subtraction of one of the input signals from the other. In the example in FIG. 8, a signal line for inputting a digital I-signal to be transmitted and a signal line for inputting a signal for correcting the I-signal from the DC offset detecting unit 811 are connected to one of the subtractors 801. A signal line for outputting the signal to the DAC 802 and to the DC offset detecting unit 811 is connected to one of the subtractors 801.

A signal line for inputting a Q-signal that is a digital signal to be transmitted and a signal line for inputting a signal for correcting the Q-signal from the DC offset detecting unit 811 are connected to the other subtractor 801. A signal line for outputting the signal to the DAC 802 and to the DC offset detecting unit 811 is connected to the other subtractor 801. In FIG. 8, the subtractors 801 subtract the compensation value b' of the modulating unit offset b input from the DC offset detecting unit 811, from the input I-signal x that is to be transmitted, and output by branching one output of the subtraction result u=x−b' to the DAC 802 and to the DC offset detecting unit 811.

The DAC 802 is a circuit similar to the DAC 502 illustrated in FIG. 5 and thus an explanation will be omitted. The QMOD 803 is a circuit similar to the QMOD 503 illustrated in FIG. 5 and thus an explanation will be omitted. The first oscillator 804 is a circuit similar to the first oscillator 504 illustrated in FIG. 5 and thus an explanation will be omitted. The amplifier 805 is a circuit similar to the amplifier 805 illustrated in FIG. 5 and thus an explanation will be omitted. The analog EPS 806 is a circuit similar to the analog EPS 506 illustrated in FIG. 5, and thus an explanation will be omitted.

The second oscillator 807 is a circuit similar to the second oscillator 507 illustrated in FIG. 5 and thus an explanation will be omitted. The QDEM 808 is a circuit similar to the QDEM 508 illustrated in FIG. 5 and thus an explanation will be omitted. The ADC 809 is a circuit similar to the ADC 509 illustrated in FIG. 5 and thus an explanation will be omitted. The digital EPS 810 is a circuit similar to the digital EPS 510 illustrated in FIG. 5 and thus an explanation will be omitted. The DC offset detecting unit 811 is a circuit similar to the DC offset detecting unit 611 illustrated in FIG. 6 and thus an explanation will be omitted.

As a result, the signal input to the amplifier 805 becomes the signal u+b=u−b'+b≈u due to the DC offset detecting unit 811 inputting the compensation value b' that becomes the same value as the modulating unit offset b into the subtractors 801. Therefore, the modulating device 100 is able to remove the modulating unit offset b from the signal to be amplified and transmitted by the amplifier 805 and is able to transmit a signal with high accuracy.

(Correction of Signals in Fourth Embodiment)

In the circuits illustrated in FIG. 8, the feedback signal $y_i$ is phase-rotated and the demodulating unit offset c is added to the feedback signal $y_i$ in the same way as illustrated in FIG. 7. The feedback signal $y_i$ is then phase-rotated in the opposite direction and the modulating unit offset b is added to the feedback signal $y_i$ to be returned to the signal $u_i$. Therefore, the DC offset detecting unit 811 in the circuits illustrated in FIG. 8 calculates the modulating unit offset b and outputs the modulating unit offset b to the subtractors 801 as the compensation value b' of the modulating unit offset b in the same way as illustrated in FIG. 7.

Fifth Embodiment of Modulating Device 100

Figure 9:
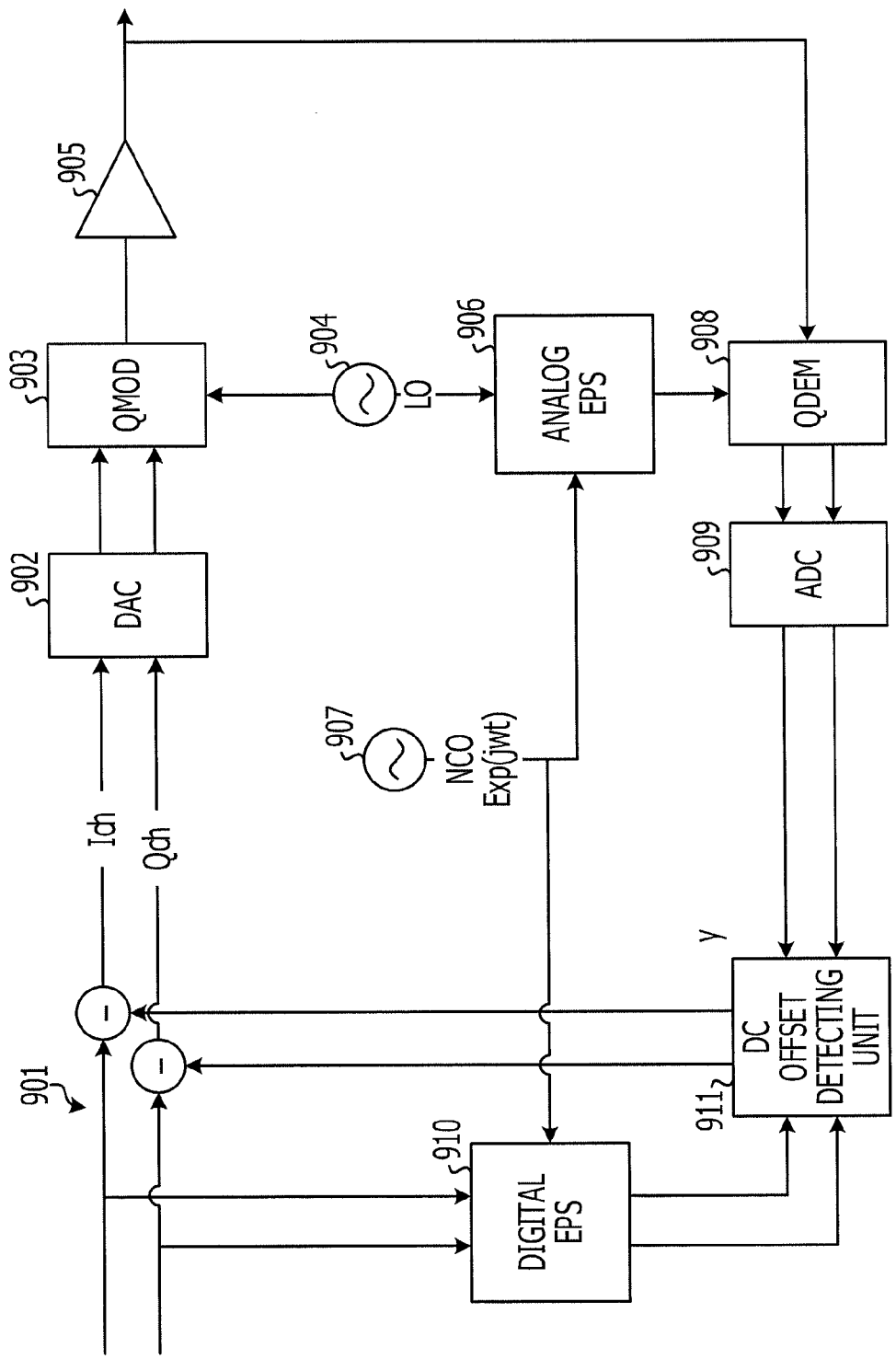
FIG. 9 illustrates a fifth embodiment of the modulating device.

FIG. 9 illustrates a fifth embodiment of the modulating device 100. The fifth embodiment is a modified example of the first embodiment.

As illustrated in FIG. 9, the modulating device 100 has two subtractors 901, a DAC 902, a QMOD 903, a first oscillator 904, an amplifier 905, an analog EPS 906, a second oscillator 907, a QDEM 908, an ADC 909, a digital EPS 910, and a DC offset detecting unit 911. A processing flow of the I-signal among the I-signals and the Q-signals will be discussed hereinbelow. The processing flow of the Q-signal is the same as the processing flow of the I-signal and thus an explanation will be omitted.

The two subtractors 901 are circuits that are similar to the two subtractors 301 illustrated in FIG. 3 and thus an explanation will be omitted. The DAC 902 is a circuit similar to the DAC 302 illustrated in FIG. 3 and thus an explanation will be omitted. The QMOD 903 is a circuit similar to the QMOD 303 illustrated in FIG. 3 and thus an explanation will be omitted. The first oscillator 904 is a circuit similar to the first oscillator 304 illustrated in FIG. 3 and thus an explanation will be omitted. The amplifier 905 is a circuit similar to the amplifier 305 illustrated in FIG. 3 and thus an explanation will be omitted. The analog EPS 906 is a circuit similar to the analog EPS 306 illustrated in FIG. 3 and thus an explanation will be omitted.

The second oscillator 907 is a circuit similar to the second oscillator 307 illustrated in FIG. 3 and thus an explanation will be omitted. The QDEM 908 is a circuit similar to the QDEM 308 illustrated in FIG. 3 and thus an explanation will be omitted. The ADC 909 is a circuit similar to the ADC 309 illustrated in FIG. 3, and thus an explanation will be omitted.

The DC offset detecting unit 911 is a four-input two-output circuit that uses two signals that are input signals from the ADC 909 and two signals that are input signals from the digital EPS 910, to output the compensation value b' signal of the modulating unit offset b. In the example in FIG. 9, a signal line for inputting the two signals from the ADC 909, a signal line for inputting the two signals from the digital EPS 910, and a signal line for outputting the signal to the subtractors 901 are connected to the DC offset detecting unit 911. In FIG. 9, the DC offset detecting unit 911 produces the compensation value b' signal of the modulating unit offset b for correcting the two signals to be transmitted, to output the compensation value b' signal to the two subtractors 901 as described below with reference to FIG. 4.

The digital EPS 910 is a three-input two-output circuit that uses the phase shift signal that is the remaining input signal to perform phase rotation on the two signals that are the input signals, and outputs the phase-rotated signal as an output signal. In the example in FIG. 9, a signal line for inputting the two digital signals to be transmitted, a signal line for inputting the phase shift signal from the second oscillator 907, and a signal line for outputting the signal to the DC offset detecting unit 911 are connected to the digital EPS 910. In FIG. 9, the digital EPS 910 performs phase rotation on the two input signals in the opposite direction and by a phase shift quantity that is the same as that of the phase rotation by the analog EPS 906, on the two input signals, and outputs the phase-rotated signals to the DC offset detecting unit 911.

As a result, the signal input to the amplifier 905 becomes the signal u+b=u−b'+b≈u due to the DC offset detecting unit 911 inputting the compensation value b' that becomes the same value as the modulating unit offset b into the subtractors 901. Therefore, the modulating device 100 is able to remove the modulating unit offset b from the signal to be amplified and transmitted by the amplifier 905 and is able to transmit a signal with high accuracy.

(Correction of Signals in Fifth Embodiment)

Figure 10:
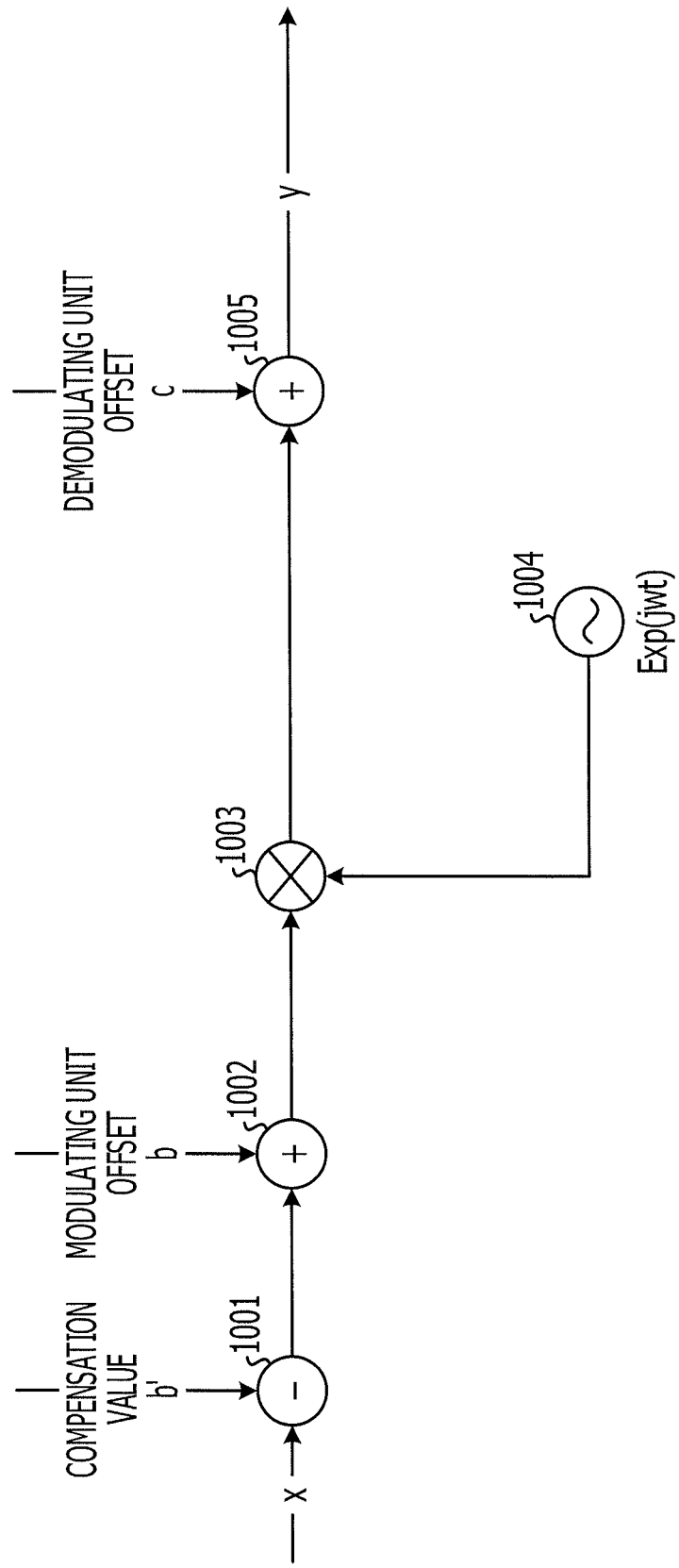
FIG. 10 illustrates a correction of a signal according to the fifth embodiment.

FIG. 10 illustrates a correction of a signal according to the fifth embodiment. FIG. 10 illustrates a flow of the signal $x_i$ until the signal $x_i$ becomes a feedback signal $y_i$ in the circuits illustrated in FIG. 9.

In the circuit illustrated in FIG. 9, the compensation value b' of the modulating unit offset b as indicated by reference numeral 1001 is subtracted from the signal $x_i$, and the modulating unit offset b as indicated by the reference numeral 1002 is added to the signal $x_i$. Further, the signal $x_i$ is phase-rotated, as indicated by reference numeral 1003, using the phase shift signal indicated by reference numeral 1004, and the demodulating unit offset c is added to the signal $x_i$ as indicated by reference numeral 1005. As a result, the signal $x_i$ is fed back as the signal $y_i$. Therefore, in the circuits illustrated in FIG. 9, an error $\epsilon_i$ between the signal $y_i$ theoretically calculated from the feedback signal $u_i$ and the actually measured signal $y_i$ is expressed by the following equation (27).

$$(au_i+b)e^{jwt}+c-y_i \times e^{jwt}=\epsilon_i \qquad (27)$$

The following equation (28) is obtained when the above equation (27) is expanded.

$$au_i e^{jwt}+be^{jwt}+c-y_i \times e^{jwt}=\epsilon_i \qquad (28)$$

The following equation (29) is obtained when the above equation (28) is transformed.

$$au_i+b+c \times e^{-jwt}-y_i=\epsilon \times e^{-jwt} \qquad (29)$$

The DC offset detecting unit 911 produces the signal for the compensation value b' of the modulating unit offset b by using the signal $x_i$ and the feedback signal $y_i$ in a period I of one cycle of $e^{-jwt}$ to apply the least-squares method in the above equation (29). In this case, the DC offset detecting unit 911 applies the least-squares method in the above equation (29) to calculate the coefficient "a", the coefficient "b", and the coefficient "c" when the error $\epsilon_i$ in the following equation (30) is the smallest.

$$\sum_{i=1}^{n}[(au_i+b+c \times e^{-jwt}-y_i)(au_i+b+c \times e^{-jwt}-y_i)^*]= \qquad (30)$$

$$\sum_{i=1}^{n}|\epsilon_i \times e^{-jwt}|^2$$

The subsequent processing is similar to the processing described with reference to FIG. 4 and thus an explanation will be omitted.

Sixth Embodiment of Modulating Device 100

Figure 11:
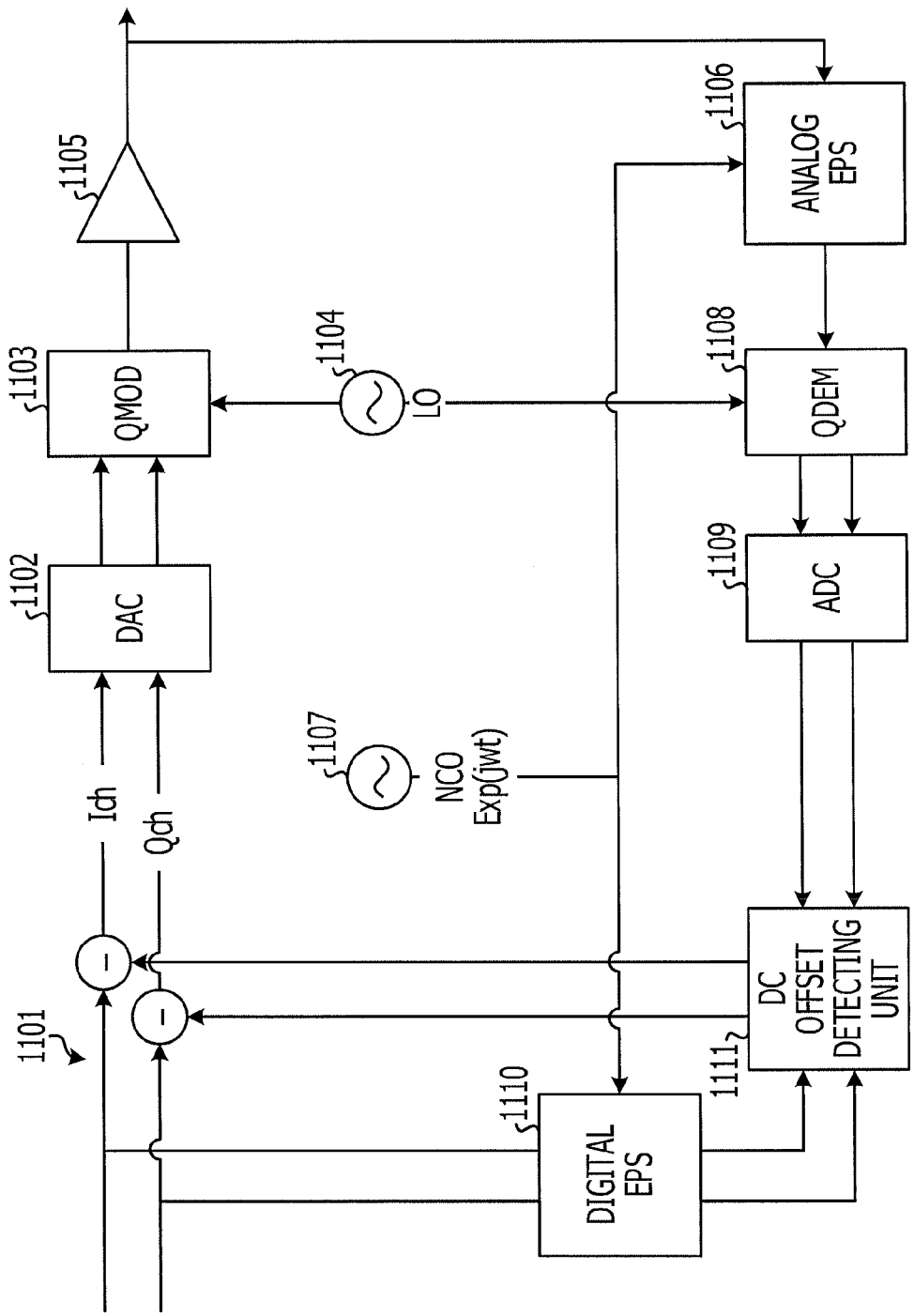
FIG. 11 illustrates a sixth embodiment of the modulating device.

FIG. 11 illustrates a sixth embodiment of the modulating device 100. The sixth embodiment is a modified example of the second embodiment.

As illustrated in FIG. 11, the modulating device 100 has two subtractors 1101, a DAC 1102, a QMOD 1103, a first oscillator 1104, an amplifier 1105, an analog EPS 1106, a second oscillator 1107, a QDEM 1108, an ADC 1109, a digital EPS 1110, and a DC offset detecting unit 1111. A processing flow of the I-signal among the I-signals and the Q-signals will be discussed hereinbelow. The processing flow of the Q-signal is the same as the processing flow of the I-signal and thus an explanation will be omitted.

The two subtractors 1101 are circuits that are similar to the two subtractors 501 illustrated in FIG. 5 and thus an explanation will be omitted. The DAC 1102 is a circuit similar to the DAC 502 illustrated in FIG. 5 and thus an explanation will be omitted. The QMOD 1103 is a circuit similar to the QMOD 503 illustrated in FIG. 5 and thus an explanation will be omitted. The first oscillator 1104 is a circuit similar to the first oscillator 504 illustrated in FIG. 5 and thus an explanation will be omitted. The amplifier 1105 is a circuit similar to the amplifier 505 illustrated in FIG. 5 and thus an explanation will be omitted. The analog EPS 1106 is a circuit similar to the analog EPS 506 illustrated in FIG. 5, and thus an explanation will be omitted.

The second oscillator 1107 is a circuit similar to the second oscillator 507 illustrated in FIG. 5 and thus an explanation will be omitted. The QDEM 1108 is a circuit similar to the QDEM 508 illustrated in FIG. 5 and thus an explanation will be omitted. The ADC 1109 is a circuit similar to the ADC 509 illustrated in FIG. 5 and thus an explanation will be omitted. The digital EPS 1110 is a circuit similar to the digital EPS 910 illustrated in FIG. 9 and thus an explanation will be omitted. The DC offset detecting unit 1111 is a circuit similar to the DC offset detecting unit 911 illustrated in FIG. 9 and thus an explanation will be omitted.

As a result, the signal input to the amplifier 1105 becomes the signal u+b=u−b'+b≈u due to the DC offset detecting unit 1111 inputting the compensation value b' that becomes the same value as the modulating unit offset b input into the subtractors 1101. Therefore, the modulating device 100 is able to remove the modulating unit offset b from the signal to be amplified and transmitted by the amplifier 1105 and is able to transmit a signal with high accuracy.

(Correction of Signals in Sixth Embodiment)

In the circuits illustrated in FIG. 11, the compensation value b' of the modulating unit offset b is subtracted from the signal $x_i$, the modulating unit offset b is added to the signal $x_i$, and then the signal $x_i$ is phase-rotated in the same way as illustrated in FIG. 10. The demodulating unit offset c is then added to the signal $x_i$ and the signal $x_i$ is then fed back as the signal $y_i$. Therefore, the DC offset detecting unit 1111 in the circuits illustrated in FIG. 11 calculates the modulating unit offset b and outputs the modulating unit offset b to the subtractors 1101 as the compensation value b' of the modulating unit offset b in the same way as illustrated in FIG. 10.

Seventh Embodiment of Modulating Device 100

Figure 12:
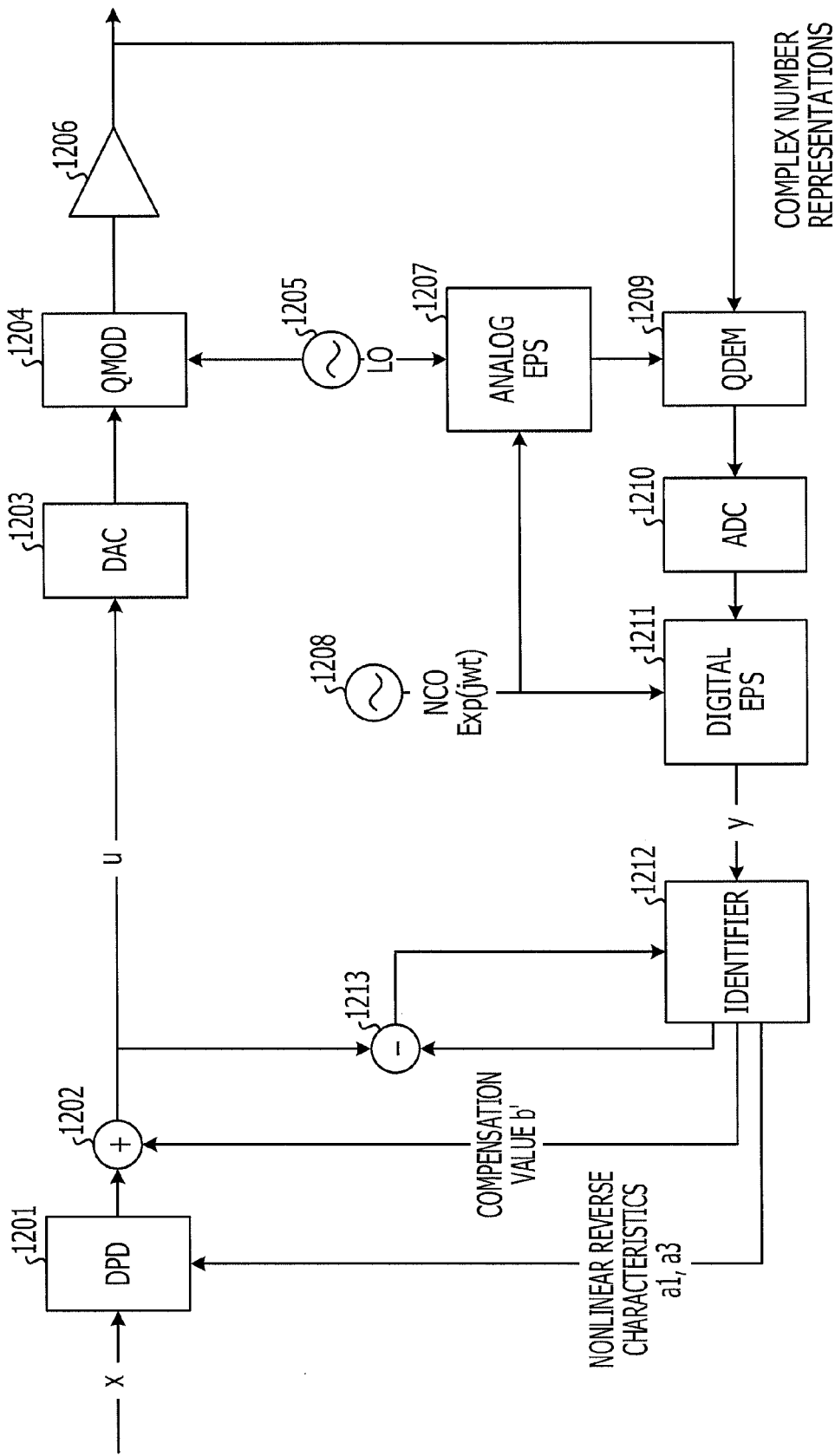
FIG. 12 illustrates a seventh embodiment of the modulating device.

FIG. 12 illustrates a seventh embodiment of the modulating device 100. The seventh embodiment is one in which a further function for compensating a distortion produced in an analog signal in the amplifier is added to the modulating device 100 according to the first embodiment.

As illustrated in FIG. 12, the modulating device 100 has a digital pre-distortion (DPD) 1201, an adder 1202, a DAC 1203, a QMOD 1204, a first oscillator 1205, an amplifier 1206, an analog EPS 1207, a second oscillator 1208, a QDEM 1209, an ADC 1210, a digital EPS 1211, an identifier 1212, and a subtractor 1213. In the following explanation, the signal x is described as a signal representing a complex number formed by combining the I-signal and the Q-signal.

The DPD 1201 is a two-input one-output circuit that compensates a signal to be transmitted that is one of the input signals by using a signal for correcting distortion that is produced in the analog signal in the amplifier 1206 and that is the other of the input signals, and outputs the compensated signal as an output signal. In the example illustrated in FIG. 12, a signal line for inputting a digital signal to be transmitted and a signal line for inputting, from the identifier 1212, a signal for compensating the distortion produced in the analog signal in the amplifier 1206, are connected to the DPD 1201. A signal line for outputting the signal to the adder 1202 is also connected to the DPD 1201. In FIG. 12, the DPD 1201 uses values a1 and a3 that have nonlinear reverse characteristics, that are input from the identifier 1212, and that become signals for compensating the distortion produced in the analog signal in the amplifier 1206, to compensate the input signal x that is to be transmitted. The DPD 1201 then outputs a compensation result x' to the adder 1202.

The adder 1202 is a two-input one-output circuit that outputs, as an output signal, an addition result of the addition of one of the input signals to the other. In the example illustrated in FIG. 12, a signal line for inputting signals from the DPD 1201 and a signal line for inputting the compensation value −b' signal of the modulating unit offset b for compensating the DC offset from the identifier 1212, are connected to the adder 1202. A signal line for outputting the signal to the DAC 1203 and to the subtractor 1213 is also connected to the adder 1202. In FIG. 12, the adder 1202 adds the compensation value b' of the modulating unit offset b input from the identifier 1212 to the signal xi' and outputs the one output addition result u=x'+b' by branching the result to the DAC 1203 and to the subtractor 1213.

The DAC 1203 is a one-input one-output circuit that performs analog conversion on a digital signal that is an input signal, and outputs the analog-converted signals as an output signal. In the example in FIG. 12, a signal line for inputting the digital signal from the adder 1202, and a signal line for outputting the signal to the QMOD 1204 are connected to the DAC 1203. In FIG. 12, the DAC 1203 performs analog conversion on the input digital signal u and outputs the analog-converted signal to the QMOD 1204. The analog-converted signal may be referred to by "u" in the same way as the digital signal in the following explanation.

The QMOD 1204 is a two-input one-output circuit that uses the local signal that is the remaining input signal to perform quadrature modulation on the analog signal that is the input signal, and outputs the quadrature-modulated signal as an output signal. In the example illustrated in FIG. 12, a signal line for inputting the analog signal from the DAC 1203, a signal line for inputting the local signal from the first oscillator 1205, and a signal line for outputting the signal to the amplifier 1206 are connected to the QMOD 1204. In FIG. 12, the QMOD 1204 performs quadrature modulation on the input signal u by using the local signal from the first oscillator 1205 and outputs the quadrature-modulated signal to the amplifier 1206. The modulating unit offset b is added to the signal u by passing through the DAC 1203 and the QMOD 1204, to become the signal u+b.

The first oscillator 1205 is a circuit similar to the first oscillator 304 illustrated in FIG. 3 and thus an explanation will be omitted. The amplifier 1206 is a circuit similar to amplifier 305 illustrated in FIG. 3 and thus an explanation will be omitted. The analog EPS 1207 is a circuit similar to the analog EPS 306 illustrated in FIG. 3 and thus an explanation will be omitted. The second oscillator 1208 is a circuit similar to the second oscillator 307 illustrated in FIG. 3 and thus an explanation will be omitted.

The QDEM 1209 is a two-input one-output circuit that uses the local signal that is phase-rotated by the phase shift signal that is one of the input signals to perform quadrature demodulation on the analog signal that is the other of the input signals, and outputs the quadrature-demodulated signal as an output signal. In the example illustrated in FIG. 12, a signal line for inputting the signal from the amplifier 1206, a signal line for inputting the signal from the analog EPS 1207, and a signal line for outputting the signal to the ADC 1210 are connected to the QDEM 1209. In FIG. 12, the QDEM 1209 uses the signal from the analog EPS 1207 to perform quadrature demodulation on the analog signal from the amplifier 1206 and outputs the signal (u+b)*EXP(jwt) to the ADC 1210.

The ADC 1210 is a one-input one-output circuit that performs digital conversion on the analog signal that is the input signal, and outputs the digital-converted signal as an output signal. In the example in FIG. 12, a signal line for inputting the signal from the QDEM 1209, and a signal line for outputting the signal to the digital EPS 1211 are connected to the ADC 1210. In FIG. 12, the ADC 1210 performs digital conversion on the signal (u+b)*EXP(jwt) input from the QDEM 1209, and outputs the digitally converted signal to the digital EPS 1211. The demodulating unit offset c is added to the signal (u+b)*EXP(jwt) that passes through the QDEM 1209 and the ADC 1210 to become the signal (u+b)*EXP(jwt)+c.

The digital EPS 1211 is a two-input one-output circuit that uses the phase shift signal that is the remaining input signal to perform phase rotation on the signal that is one of the input signals, and outputs the phase-rotated signal as an output signal. In the example illustrated in FIG. 12, a signal line for inputting the signal from the ADC 1210, a signal line for inputting the phase shift signal from the second oscillator

1208, and a signal line for outputting the signal to the identifier 1212, are connected to the digital EPS 1211. In FIG. 12, the digital EPS 1211 uses the phase shift signal from the second oscillator 1208 to perform phase rotation on the input signal in the opposite direction and by a phase shift quantity that is the same as that of the phase rotation by the analog EPS 1207, and outputs the phase-rotated signal to the identifier 1212.

The identifier 1212 is a two-input three-output circuit that uses the signal from the digital EPS 1211 that is an input signal, and a signal from the subtractor 1213 that is an input signal, to output the nonlinear reverse characteristic values a1 and a3 and the compensation value b' signal of the modulating unit offset b. In the example illustrated in FIG. 12, a signal line for inputting the signal from the digital EPS 1211, a signal line for inputting the signal from the subtractor 1213, and a signal line for outputting the signal to the DPD 1201, the adder 1202, and to the subtractor 1213, are connected to the identifier 1212. In FIG. 12, the identifier 1212 produces signals of the nonlinear reverse characteristic values a1 and a3 for compensating the distortion produced on the analog signal in the amplifier 1206 and outputs the produced signals to the DPD 1201 as described below in reference to FIG. 13. The identifier 1212 produces the compensation value b' signal of the modulating unit offset b for correcting the digital signal to be transmitted and outputs the compensation value b' signal to the adder 1202 and to the subtractor 1213 as described below with reference to FIG. 13.

The subtractor 1213 is a two-input one-output circuit that outputs, as an output signal, a subtraction result of the subtraction of one of the input signals from the other. In the example illustrated in FIG. 12, a signal line for inputting the signal from the adder 1202, a signal line for inputting the signal from the identifier 1212, and a signal line for outputting the signal to the identifier 1212, are connected to the subtractor 1213. In FIG. 12, the subtractor 1213 subtracts the signal input from the identifier 1212 from the signal u input from the adder 1202, and outputs the subtraction result to the identifier 1212. As a result, the modulating device 100 is able to compensate the distortion of the signal in the amplifier 1206 and the modulating unit offset b, and is able to transmit a signal with high accuracy.

(Correction of Signal in Seventh Embodiment)

Figure 13:
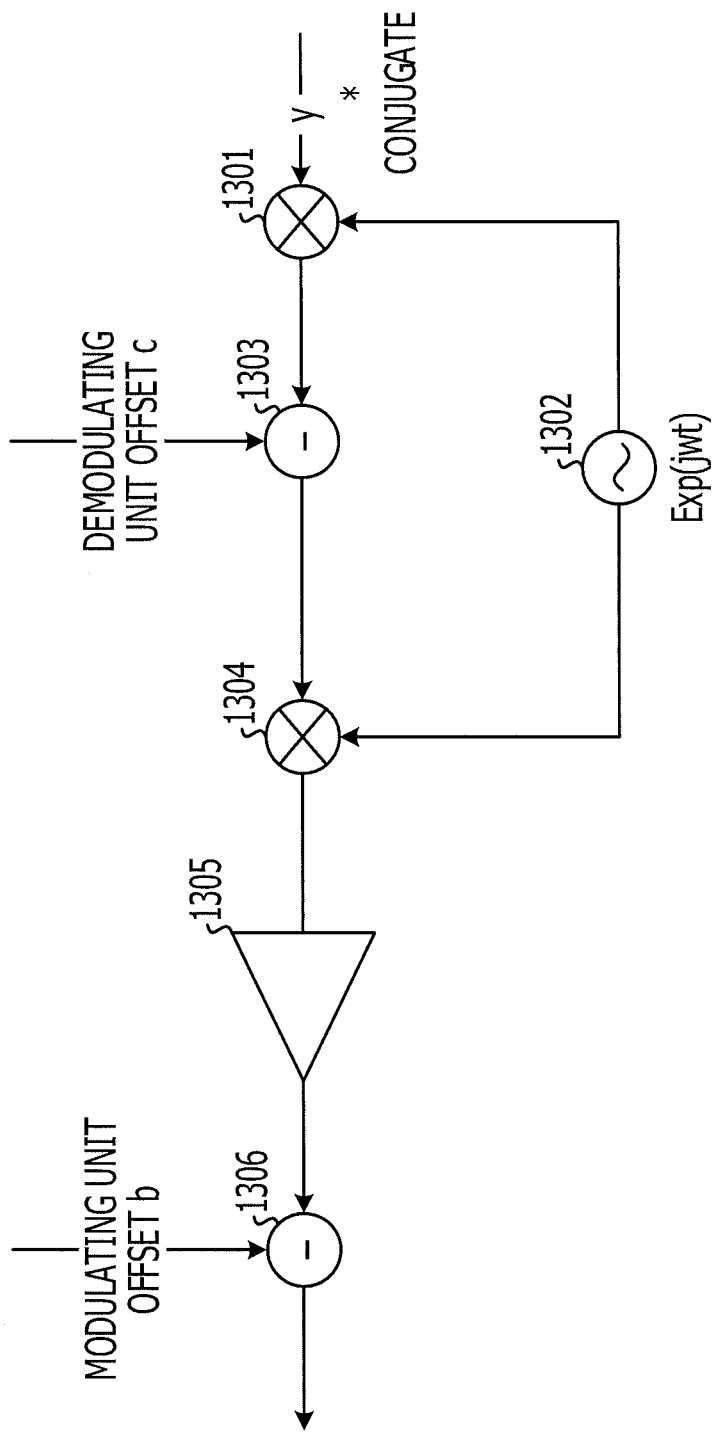
FIG. 13 illustrates a correction of a signal according to the seventh embodiment.

FIG. 13 illustrates a correction of a signal according to the seventh embodiment.

In the circuits in FIG. 12, the feedback signal $y_i$ is phase-rotated, as indicated by the reference numeral 1301, by using the phase shift signal indicated by the reference numeral 1302, and the demodulating unit offset c is subtracted from the feedback signal $y_i$ as indicated by the reference numeral 1303. Further, as indicated by reference numeral 1304, the feedback signal $y_i$ is phase-rotated in the direction opposite to that of the phase rotation indicated by reference numeral 1301, by using the phase shift signal indicated by reference numeral 1302. The feedback signal $y_i$ is then amplified in the negative direction as indicated by the reference numeral 1305 and the modulating unit offset b is subtracted as indicated by the reference numeral 1306. As a result, the feedback signal $y_i$ is returned to the signal $u_i$. Therefore, in the circuits illustrated in FIG. 12, an error $\epsilon_i$ between the signal $u_i$ theoretically calculated from the feedback signal $y_i$ and the actually measured signal $u_i$ is expressed by the following equation (31).

$$a_1(y_i + c \times e^{jwt}) + a_3|y_i + c \times e^{jwt}|^2 (y_i + c \times e^{jwt}) + b - u_i = \epsilon_i \quad (31)$$

Since the offset is a small value with respect to the signal, the above equation (31) approximates the following equation (32).

$$a_1 y_i + a_1 c \times e^{jwt} + a_3 |y_i|^2 y_i + b - u_i = \epsilon_i \quad (32)$$

The identifier 1212 produces the signal for compensating the two digital signals that are to be transmitted, by applying the least-squares method to the above equation (32). In this case, the identifier 1212 applies the least-squares method in the above equation (32) to calculate the coefficient "$a_1$", the coefficient "$a_3$", the coefficient "b", and the coefficient "c" when the error $\epsilon_i$ in the following equation (33) is the smallest.

$$\sum_{i=1}^{n} [(a_1 y_i + a_3 |y_i|^2 y_i + b + a_1 c \times e^{jwt} - u_i) \quad (33)$$

$$(a_1 y_i + a_3 |y_i|^2 y_i + b + a_1 c \times e^{jwt} - u_i)^*] = \sum_{i=1}^{n} |\epsilon_i|^2$$

The error $\epsilon_i$ in the above equation (33) becomes the smallest when the following equations (34) to (37) that are equations differentiated from the above equation (33) become 0.

$$\sum_{i=1}^{n} [y_i^*(a_1 y_i + a_3 |y_i|^2 y_i + b + a_1 c \times e^{jwt} - u_i)] = 0 \quad (34)$$

$$\sum_{i=1}^{n} [|y_i|^2 y_i^*(a_1 y_i + a_3 |y_i|^2 y_i + b + a_1 c \times e^{jwt} - u_i)] = 0 \quad (35)$$

$$\sum_{i=1}^{n} [(a_1 y_i + a_3 |y_i|^2 y_i + b + a_1 c \times e^{jwt} - u_i)] = 0 \quad (36)$$

$$\sum_{i=1}^{n} [e^{jwt}(a_1 y_i + a_3 |y_i|^2 y_i + b + a_1 c \times e^{jwt} - u_i)] = 0 \quad (37)$$

The following equation (38) is obtained when the above equations (34) to (37) are expressed as a matrix.

$$\begin{bmatrix} \sum_{i=1}^{n} |y_i|^2 & \sum_{i=1}^{n} |y_i|^4 & \sum_{i=1}^{n} y_i^* & \sum_{i=1}^{n} y_i^* e^{jwt} \\ \sum_{i=1}^{n} |y_i|^4 & \sum_{i=1}^{n} |y_i|^6 & \sum_{i=1}^{n} |y_i|^2 y_i^* & \sum_{i=1}^{n} |y_i|^2 y_i^* e^{jwt} \\ \sum_{i=1}^{n} y_i & \sum_{i=1}^{n} |y_i|^2 y_i & n & \sum_{i=1}^{n} e^{jwt} \\ \sum_{i=1}^{n} y_i e^{-jwt} & \sum_{i=1}^{n} |y_i|^2 y_i e^{-jwt} & \sum_{i=1}^{n} e^{-jwt} & n \end{bmatrix} \quad (38)$$

$$\begin{bmatrix} a_1 \\ a_3 \\ b \\ a_1 c \end{bmatrix} = \begin{bmatrix} \sum_{i=1}^{n} u_i y_i^* \\ \sum_{i=1}^{n} |y_i|^2 y_i^* u_i \\ \sum_{i=1}^{n} u_i \\ \sum_{i=1}^{n} u_i e^{-jwt} \end{bmatrix}$$

The following equation (39) is obtained when the above equation (38) is transformed.

$$\begin{bmatrix} a_1 \\ a_3 \\ b \\ a_1 c \end{bmatrix} = \qquad (39)$$

$$\begin{bmatrix} \sum_{i=1}^{n} |y_i|^2 & \sum_{i=1}^{n} |y_i|^4 & \sum_{i=1}^{n} y_i^* & \sum_{i=1}^{n} y_i^* e^{jwt} \\ \sum_{i=1}^{n} |y_i|^4 & \sum_{i=1}^{n} |y_i|^6 & \sum_{i=1}^{n} |y_i|^2 y_i^* & \sum_{i=1}^{n} |y_i|^2 y_i^* e^{jwt} \\ \sum_{i=1}^{n} y_i & \sum_{i=1}^{n} |y_i|^2 y_i & n & \sum_{i=1}^{n} e^{jwt} \\ \sum_{i=1}^{n} y_i e^{-jwt} & \sum_{i=1}^{n} |y_i|^2 y_i e^{-jwt} & \sum_{i=1}^{n} e^{-jwt} & n \end{bmatrix}^{-1}$$

$$\begin{bmatrix} \sum_{i=1}^{n} u_i y_i^* \\ \sum_{i=1}^{n} |y_i|^2 y_i^* u_i \\ \sum_{i=1}^{n} u_i \\ \sum_{i=1}^{n} u_i e^{-jwt} \end{bmatrix}$$

In this case, the coefficient c is found with the following equation (40).

$$c = \frac{a_1 c}{a_1} \qquad (40)$$

In this case, the identifier 1212 calculates the coefficients $a_1$ and $a_3$ and the compensation value b' of the modulating unit offset b by substituting the digital signal $u_i$ in the period I of one cycle and that is to be transmitted and the feedback signal $y_i$ in the period I of one cycle, into the above equation (39). The identifier 1212 then outputs the calculated coefficients $a_1$ and $a_3$ to the DPD 1201 and outputs the calculated compensation value b' of the modulating unit offset b to the adder 1202. A further function for compensating the distortion produced in an analog signal in the amplifier 1206 may be further added to the modulating device 100 according to the third and fifth embodiments in the same way as illustrated in FIG. 12.

Eighth Embodiment of Modulating Device 100

Figure 14:
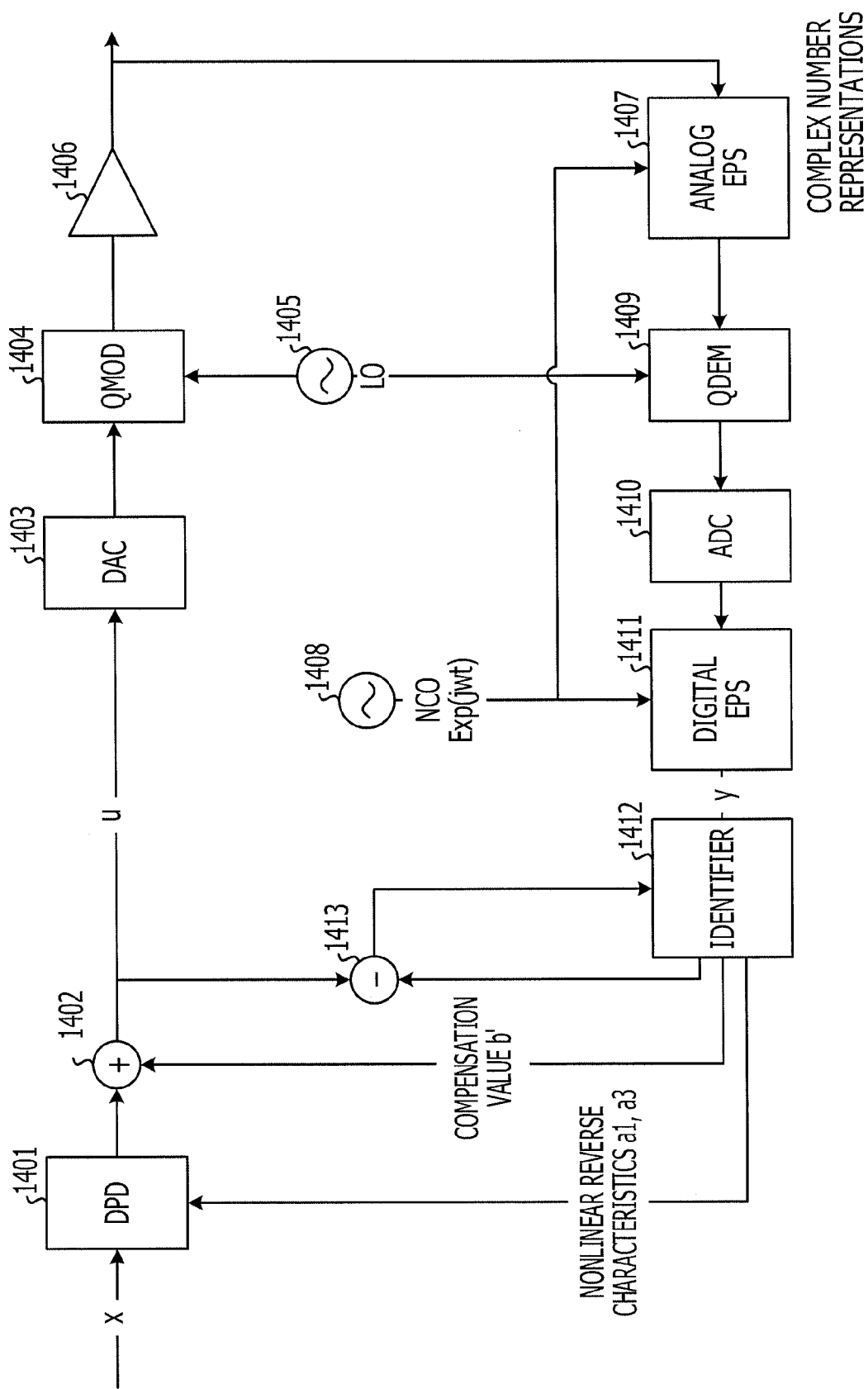
FIG. 14 illustrates an eighth embodiment of the modulating device.

FIG. 14 illustrates an eighth embodiment of the modulating device 100. The eighth embodiment is one in which a further function for compensating the distortion produced in an analog signal in the amplifier is added to the modulating device 100 according to the second embodiment.

As illustrated in FIG. 14, the modulating device 100 has a DPD 1401, an adder 1402, a DAC 1403, a QMOD 1404, a first oscillator 1405, an amplifier 1406, an analog EPS 1407, a second oscillator 1408, a QDEM 1409, an ADC 1410, a digital EPS 1411, an identifier 1412, and a subtractor 1413. In the following explanation, the signal x is described as a signal representing a complex number formed by combining the I-signal and the Q-signal.

The DPD 1401 is a circuit similar to the DPD 1201 illustrated in FIG. 12 and thus an explanation will be omitted. The adder 1402 is a circuit similar to the adder 1202 illustrated in FIG. 12 and thus an explanation will be omitted. The DAC 1403 is a circuit similar to the DAC 1203 illustrated in FIG. 12 and thus an explanation will be omitted. The QMOD 1404 is a circuit similar to the QMOD 1204 illustrated in FIG. 12 and thus an explanation will be omitted.

The first oscillator 1405 is a circuit similar to the first oscillator 504 illustrated in FIG. 5 and thus an explanation will be omitted. The amplifier 1406 is a circuit similar to the amplifier 505 illustrated in FIG. 5 and thus an explanation will be omitted. The analog EPS 1407 is a circuit similar to the analog EPS 506 illustrated in FIG. 5, and thus an explanation will be omitted. The second oscillator 1408 is a circuit similar to the second oscillator 507 illustrated in FIG. 5 and thus an explanation will be omitted.

The QDEM 1409 is a two-input one-output circuit that uses the local signal that is one of the input signals to perform quadrature demodulation on the analog signal that is the other of the input signals, and outputs the quadrature-demodulated signal as an output signal. In the example in FIG. 14, a signal line for inputting the signal from the analog EPS 1407, a signal line for inputting the local signal from the first oscillator 1405, and a signal line for outputting the signal to the ADC 1410, are connected to the QDEM 1409. In FIG. 14, the QDEM 1409 uses the local signal from the first oscillator 1405 to perform quadrature demodulation on the analog signal from the analog EPS 1407 to output the signal (u+b)*EXP (jwt) to the ADC 1410.

The ADC 1410 is a circuit similar to the ADC 1210 illustrated in FIG. 12 and thus an explanation will be omitted. The digital EPS 1411 is a circuit similar to the digital EPS 1211 illustrated in FIG. 12 and thus an explanation will be omitted. The identifier 1412 is a circuit similar to the identifier 1212 illustrated in FIG. 12 and thus an explanation will be omitted. The subtractor 1413 is a circuit similar to the subtractor 1213 illustrated in FIG. 12 and thus an explanation will be omitted. As a result, the modulating device 100 is able to compensate the distortion of the signal in the amplifier 1406 and the modulating unit offset b, and is able to transmit a signal with high accuracy.

(Correction of Signal in Eighth Embodiment)

In the circuits illustrated in FIG. 14, the feedback signal $y_i$ is phase-rotated, the demodulating unit offset c is subtracted from the feedback signal $y_i$, and the feedback signal $y_i$ is then phase-rotated in the reverse direction in the same way as illustrated in FIG. 13. The feedback signal $y_i$ is then amplified in the negative direction and the modulating unit offset b is subtracted from the feedback signal $y_i$ to obtain the signal $u_i$. Therefore, in the circuits illustrated in FIG. 14, the identifier 1412 calculates the coefficients $a_1$ and $a_3$ in the same way as in FIG. 13 and outputs the coefficients to the DPD 1401. The identifier 1412 also calculates the compensation value b' of the modulating unit offset b and outputs the compensation value b' to the adder 1402 in the same way as in FIG. 13.

As described above, based on the modulating device 100 according to the embodiments discussed herein, the modulation signal may be fed back while being phase-rotated, and the DC offset produced in the quadrature modulation circuit may be calculated on the basis of the signal to be transmitted and the fed back signal. As a result, the modulating device 100 according to the embodiments discussed herein removes the calculated DC offset from the modulation signal and is able to transmit the modulation signal with high accuracy.

Similarly, based on the modulating device 100 according to the embodiments discussed herein, the modulation signal is phase-rotated, demodulated, and then fed back so that the DC offset produced in the quadrature modulation circuit may be calculated on the basis of the signal to be transmitted and the fed back signal. As a result, based on the modulating device 100 according to the embodiments discussed herein, the modulating unit offset is set as a direct current element and the demodulating unit offset is set as a periodically changing element so that the time desired for calculating the modulating unit offset may be reduced. Moreover, based on the modulating device 100 according to the embodiments discussed herein, a coefficient for compensating the distortion produced on the modulation signal in the amplifier may be calculated. As a result, the modulating device 100 according to the embodiments discussed herein uses the calculated coefficient to compensate the modulation signal and thus is able to transmit the modulation signal with high accuracy.

Moreover, for example, a conventional modulating device may have a feedback circuit that provides feedback by performing quadrature demodulation on the modulation signal with a quadrature demodulation circuit. In this case, the conventional modulation device inputs the modulation signal into the feedback circuit to calculate an average value of the sum of the modulating unit offset and the demodulating unit offset within the time period of the input. Further, the conventional modulation device does not input the modulation signal into the feedback circuit to calculate an average value of the sum of the demodulating unit offset within the time period of the non-input. Thus in the conventional modulating device, the modulating unit offset is calculated by subtracting the average value of the demodulating unit offset from the average value of the sum of the modulating unit offset and the demodulating unit offset. However, at the point in time that the modulation signal is compensated, the actual modulating unit offset and the calculated modulating unit offset are different and the accuracy of the calculated modulating unit offset may be poor. Conversely, based on the modulating device 100 according to the embodiments discussed herein, the calculation of the modulating unit offset may be performed continuously and the accuracy of the modulating unit offset may be improved.

Similarly, a conventional modulating device may calculate the modulating unit offset by using a frequency converting circuit to convert the modulation signal to an IF signals and then use an ADC to perform digital conversion to provide feedback. However, in this case, the conventional modulating device uses a quadrature demodulation circuit realized by a high-speed ADC and digital signal processing thus resulting in an increase in cost and an increase in power consumption. Conversely, the modulating device 100 according to the embodiments discussed herein exhibits a lower cost and reduced power consumption in comparison to the case of using the quadrature demodulation circuit realized by the high-speed ADC and the digital signal processing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A modulating device adapted to receive a digital input signal and produce an analog output signal, the modulating device comprising:
    a first convertor configured to receive the digital input signal and generate a converted analog signal by analog conversion on the digital input signal;
    a modulator configured to receive the converted analog signal and generate a modulated signal by quadrature modulation on the converted analog signal based on a local signal from a first oscillator;
    a first phase shifter configured to receive the local signal from the first oscillator and a phase shift signal from a second oscillator, and generate a first phase rotated signal by performing a first phase rotation on the local signal using the phase shift signal from the second oscillator, the phase shift signal being a signal that is phase rotated by a phase shift amount that changes with a period;
    a demodulator configured to receive the analog output signal and the first phase rotated signal, and generate a demodulated signal by quadrature demodulation on the analog output signal using the first phase rotated signal, the analog output signal being based on the modulated signal;
    a second convertor configured to receive the demodulated signal and generate an analog-to-digital converted signal by digital conversion on the demodulated signal;
    a second phase shifter configured to receive the analog-to-digital converted signal and the phase shift signal from the second oscillator, and generate a second phase rotated signal by performing a second phase rotation on the analog-to-digital converted signal using the phase shift signal, by the phase shift amount in a direction opposite to a direction of the first phase rotation;
    a calculating circuit configured to estimate a first direct current offset based at least in part on the digital input signal and the second phase rotated signal, the first direct current offset corresponding to a noise component of digital current components generated in a signal path between the digital input signal inputted to the first convertor and the analog output signal inputted to the demodulator; and
    a correcting circuit configured to correct the digital input signal based on the first direct current offset.

2. The modulating device according to claim 1, wherein the calculating circuit is further configured to estimate the first direct current offset based at least in part on the digital input signal and the second phase rotated signal.

3. The modulating device according to claim 1,
    wherein the calculating circuit is further configured to store information relating to the first direct current offset, the analog-to-digital converted signal, and a second direct current offset being corresponding to a noise component of digital current components generated in a signal path between the analog output signal inputted to the demodulator and the analog-to-digital converted signal inputted to the calculating circuit, and
    wherein the calculating circuit is further configured to estimate the first direct current offset based on the information, the digital input signal, and the analog-to-digital converted signal.

4. The modulating device according to claim 1, wherein the calculating circuit is further configured to estimate the first direct current offset based on an integrated value of differences between the digital input signal and the analog-to-digital converted signal per the period.

5. The modulating device according to claim 1, further comprising:
an amplifier configured to receive the modulated signal and produce the analog output signal by amplifying the modulated signal,
wherein:
the calculating circuit is further configured to estimate a correction coefficient in accordance with distortions generated in the amplifier based on the digital input signal and the analog-to-digital converted signal, and
the correcting circuit is further configured to correct the digital input signal based on the first direct current offset and the correction coefficient.

6. A modulating device configured to receive a digital input signal and produce an analog output signal, the modulating device comprising:
a first convertor configured to receive the digital input signal and produce a converted analog signal by analog conversion on the digital input signal;
a modulator configured to receive the converted analog signal and generate a modulated signal by quadrature modulation on the converted analog signal based on a local signal from a local oscillator;
a first phase shifter configured to receive the analog output signal and a phase shift signal from a second oscillator, and generate a first phase rotated signal by performing a first phase rotation on the analog output signal using the phase shift signal from the second oscillator, the phase shift signal being a signal that is phase rotated by a phase shift amount that changes with a period, the analog output signal being produced based on the modulated signal;
a demodulator configured to receive the first phase rotated signal and a local signal from a first oscillator, and produce a demodulated signal by quadrature demodulation on the first phase rotated signal;
a second convertor configured to receive the demodulated signal and produce an analog-to-digital converted signal by digital conversion on the demodulated signal;
a second phase shifter configured to receive the analog-to-digital converted signal and the phase shift signal from the second oscillator, and generate a second phase rotated signal by performing a second phase rotation on the analog-to-digital converted signal using the phase shift signal, by the phase shift amount in a direction opposite to a direction of the first phase rotation;
a calculating circuit configured to receive the second phase rotated signal and the digital input signal, and estimate a first direct current offset based on the digital input signal and the second phase rotated signal, the first direct current offset being corresponding to a noise component of digital current components generated in a signal path between the digital input signal inputted to the first convertor and the analog output signal inputted to the first phase shifter; and
a correcting circuit configured to correct the digital input signal based on the first direct current offset.

7. The modulating device according to claim 6, wherein the calculating circuit is further configured to estimate the first direct current offset based on the digital input signal and the second phase rotated signal.

8. The modulating device according to claim 6,
wherein the calculating circuit is further configured to store information relating to the first direct current offset, the analog-to-digital converted signal, and a second direct current offset corresponding to a noise component of digital current components generated in a signal path between the analog output signal inputted to the first phase shifter and the analog-to-digital converted signal inputted to the calculating circuit, and
wherein the calculating circuit is further configured to estimate the first direct current offset based on the information, the digital input signal, and the analog-to-digital digital signal.

9. The modulating device according to claim 6, wherein the calculating circuit is further configured to estimate the first direct current offset based on an integrated value of differences between the digital input signal and the analog-to-digital converted signal per the period.

10. The modulating device according to claim 6, further comprising:
an amplifier configured to receive the modulated signal and generate the analog output signal by amplifying the modulated signal,
wherein:
the calculating circuit is further configured to estimate a correction coefficient in accordance with distortions generated in the amplifier based on the digital input signal and the analog-to-digital converted signal, and
the correcting circuit is further configured to correct the digital input signal based on the first direct current offset and the correction coefficient.

11. A modulating method to be implemented in a modulating device, the modulating method comprising:
generating a digital-to-analog converted signal by analog conversion on a digital input signal;
generating a modulated signal by quadrature modulation on the digital-to-analog converted signal;
generating a first phase rotated signal by performing a first phase rotation on a local signal from a first oscillator using a phase shift signal from a second oscillator, the phase shift signal being a signal that is phase rotated by a phase shift amount that changes with a period;
generating a demodulated signal by quadrature demodulation on an analog output signal using the first phase rotated signal, the analog output signal being produced based on the modulated signal and being outputted from the modulating device;
generating an analog-to-digital converted signal by performing digital conversion on the demodulated signal;
generating a second phase rotated signal by performing a second phase rotation on the analog-to-digital converted signal using the phase shift signal from the second oscillator by the phase shift amount in a direction opposite to a direction of the first phase rotation;
estimating a first direct current offset based on the digital input signal and the second phase rotated signal, the first direct current offset being corresponding to a noise component of digital current components generated in a signal path between the digital input signal to which the analog conversion is applied and the analog output signal that is demodulated; and
correcting at least the digital input signal based on the first direct current offset.

12. A modulating device adapted to receive a digital input signal and produce an analog output signal, the modulating device comprising:
a first convertor configured to receive the digital input signal and generate a converted analog signal by analog conversion on the digital input signal;
a modulator configured to receive the converted analog signal and generate a modulated signal by quadrature modulation on the converted analog signal based on a local signal from a first oscillator;

a first phase shifter configured to receive the local signal and a phase shift signal from a second oscillator, and generate a first phase rotated signal by performing a first phase rotation on the local signal using the phase shift signal from the second oscillator, the phase shift signal being a signal that is phase rotated by a phase shift amount that changes with a period;

a demodulator configured to receive the analog output signal and the first phase rotated signal, and generate a demodulated signal by quadrature demodulation on the analog output signal using the first phase rotated signal, the analog output signal being based on the modulated signal;

a second convertor configured to receive the demodulated signal and generate an analog-to-digital converted signal by digital conversion on the demodulated signal;

a second phase shifter configured to receive the digital input signal and the phase shift signal, and generate a second phase rotated signal by performing a second phase rotation on the digital input signal by the phase shift amount in a direction opposite to a direction of the first phase rotation;

a calculating circuit configured to estimate a first direct current offset based at least in part on the second phase rotated signal and the analog-to-digital converted signal, the first direct current offset corresponding to a noise component of digital current components generated in a signal path between the digital input signal inputted to the first convertor and the analog output signal inputted to the demodulator; and a correcting circuit configured to correct the digital input signal based on the first direct current offset.

13. A modulating device adapted to receive a digital input signal and produce an analog output signal, the modulating device comprising:

a first convertor configured to receive the digital input signal and produce a converted analog signal by analog conversion on the digital input signal;

a modulator configured to receive the converted analog signal and generate a modulated signal by quadrature modulation on the converted analog signal based on a local signal from a first oscillator;

a first phase shifter configured to receive the analog output signal and a phase shift signal from a second oscillator, and generate a first phase rotated signal by performing a first phase rotation on the analog output signal using the phase shift signal from the second oscillator, the phase shift signal being a signal that is phase rotated by a phase shift amount that changes with a period, the analog output signal being based on the modulated signal;

a demodulator configured to receive the local signal and the first phase rotated signal, and produce a demodulated signal by quadrature demodulation on the first phase rotated signal;

a second convertor configured to receive the demodulated signal and produce an analog-to-digital signal by digital conversion on the demodulated signal;

a second phase shifter configured to receive the digital input signal and the phase shift signal from the second oscillator, and generate a second phase rotated signal by performing a second phase rotation on the digital input signal using the phase shift signal by the phase shift amount in a direction opposite to a direction of the first phase rotation;

a calculating circuit configured to receive the second phase rotated signal and estimate a first direct current offset based on the second phase rotated signal and the analog-to-digital signal, the first direct current offset being corresponding to a noise component of digital current components generated in a signal path between the digital input signal inputted to the first convertor and the analog output signal inputted to the first phase shifter; and a correcting circuit configured to correct the digital input signal based on the first direct current offset.

* * * * *